(12) United States Patent
Inoue et al.

(10) Patent No.: US 11,962,289 B2
(45) Date of Patent: Apr. 16, 2024

(54) FILTER AND MULTIPLEXER

(71) Applicant: TAIYO YUDEN CO., LTD., Tokyo (JP)

(72) Inventors: Makoto Inoue, Tokyo (JP); Hideyuki Sekine, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 445 days.

(21) Appl. No.: 17/172,431

(22) Filed: Feb. 10, 2021

(65) Prior Publication Data

US 2021/0265979 A1 Aug. 26, 2021

(30) Foreign Application Priority Data

Feb. 25, 2020 (JP) .................. 2020-029491

(51) Int. Cl.
| | |
|---|---|
| H03H 9/64 | (2006.01) |
| H03H 7/01 | (2006.01) |
| H03H 9/05 | (2006.01) |
| H03H 1/00 | (2006.01) |
| H03H 9/72 | (2006.01) |

(52) U.S. Cl.
CPC ........ *H03H 9/6453* (2013.01); *H03H 7/0115* (2013.01); *H03H 9/0576* (2013.01); *H03H 2001/0085* (2013.01); *H03H 9/725* (2013.01)

(58) Field of Classification Search
CPC ......... H03H 2001/0085; H03H 7/0115; H03H 9/6453
USPC .................................................. 333/175, 185
See application file for complete search history.

(56) References Cited

U.S. PATENT DOCUMENTS

| | | | |
|---|---|---|---|
| 2003/0076199 A1* | 4/2003 | Yamaguchi ......... | H01P 1/20381 333/175 |
| 2013/0127566 A1 | 5/2013 | Iwaki et al. .................. | 333/133 |
| 2013/0154769 A1 | 6/2013 | Masuda ........................ | 333/185 |

(Continued)

FOREIGN PATENT DOCUMENTS

| | | |
|---|---|---|
| CN | 103166588 A | 6/2013 |
| JP | 2018-023044 A | 2/2018 |

(Continued)

OTHER PUBLICATIONS

First Notification of Office Action dated Jan. 19, 2024, issued by the China National Intellectual Property Administration in corresponding application 202110200437.X.

*Primary Examiner* — Rakesh B Patel
(74) *Attorney, Agent, or Firm* — Stein IP. LLC

(57) ABSTRACT

A filter includes first and second signal terminals, a filter circuit connected between the first and second signal terminals, a substrate having first and second surfaces, the first and second signal terminals being located on the first surface, a part of the filter circuit being located at a side of the second surface, a line located closer to the first surface than the filter circuit in the substrate, a first end of the line being connected to one of the first and second signal terminals, and a ground terminal that is located on the first surface and to which a second end of the line is connected, an area of a region where the line overlaps with the ground terminal being greater than an area of a region where the line overlaps with the one of the first and second signal terminals when the substrate is viewed in plan view.

7 Claims, 16 Drawing Sheets

(56) References Cited

U.S. PATENT DOCUMENTS

2018/0041194 A1 2/2018 Ito et al.
2018/0159508 A1 6/2018 Irieda et al.

FOREIGN PATENT DOCUMENTS

| JP | 2018-129680 A | 8/2018 |
| JP | 2018-129683 A | 8/2018 |

* cited by examiner

FILTER AND MULTIPLEXER

CROSS-REFERENCE TO RELATED APPLICATION

This application is based upon and claims the benefit of priority of the prior Japanese Patent Application No. 2020-029491, filed on Feb. 25, 2020, the entire contents of which are incorporated herein by reference.

FIELD

A certain aspect of the present embodiments relates to a filter and a multiplexer.

BACKGROUND

Filters including both an inductor and a capacitor (i.e., LC filters) have been widely used in the communications field as high-frequency filters. The LC filter is constructed by stacking dielectric layers such as ceramic layers. As the communication devices are sophisticated, there is increasing interest in a new communications standard such as a 5G mobile communication system. The filters used for such a standard are required to have high frequencies and a high degree of suppression. The LC filter may be unable to adequately satisfy these requirements. A filter including an acoustic wave resonator having an excellent steepness and the LC has been known as disclosed in Japanese Patent Application Publication Nos. 2018-129680 and 2018-129683.

SUMMARY

When an inductor is used as a matching circuit in the filter including the acoustic wave resonator and the LC, the inductance of the inductor as a matching circuit varies according to the distance between the inductor and the mounting board, and the filter characteristics thereby varies. Alternatively, the suppression in the attenuation band may be insufficient. When the number of stages in the filter is increased to increase the suppression, the filter becomes larger.

According to a first aspect of the present embodiments, there is provided a filter including: a first signal terminal; a second signal terminal; a filter circuit connected between the first signal terminal and the second signal terminal; a substrate having a first surface and a second surface opposite from the first surface, the first signal terminal and the second signal terminal being located on the first surface, at least a part of the filter circuit being located at a side of the second surface; a line located closer to the first surface than the filter circuit in the substrate, a first end of the line being connected to one of the first signal terminal and the second signal terminal; and a ground terminal that is located on the first surface and to which a second end of the line is connected, an area of a region where the line overlaps with the ground terminal being greater than an area of a region where the line overlaps with the one of the first signal terminal and the second signal terminal when the substrate is viewed in plan view.

According to a second aspect of the present embodiments, there is provided a filter including: a first signal terminal; a second signal terminal; a first element having a first end connected to a ground, the first element being selected from a group consisting of an acoustic wave resonator, an inductor, and a capacitor, a second element connected between the first signal terminal and the second signal terminal, the second element being selected from an inductor and a capacitor when the first element is an acoustic wave resonator, the second element being an acoustic wave resonator when the first element is an inductor or a capacitor; a third element that is connected in parallel to the second element between the first signal terminal and the second signal terminal and selected from an inductor and a capacitor, a type of the third element being different from a type of the first element when an inductor or a capacitor is selected as the first element, the type of the third element being different from a type of the second element when an inductor or a capacitor is selected as the second element; a fourth element that is connected in series with the third element and is connected in parallel to the second element between the first signal terminal and the second signal terminal, a second end of the first element being connected between the fourth element and the third element, the fourth element being selected from an inductor or a capacitor, a type of the fourth element being identical to the type of the third element; a first inductor having a first end that is connected between the first signal terminal and the second element and is connected between the first signal terminal and the third element; a second inductor having a first end that is connected between the second signal terminal and the second element and is connected between the first signal terminal and the fourth element; and a third inductor having a first end that is connected to a second end of the first inductor and a second end of the second inductor, and a second end that is connected to a ground.

According to a third aspect of the present embodiments, there is provided a multiplexer including any one of the above filters.

DETAILED DESCRIPTION

Hereinafter, a description will be given of embodiments of the present disclosure with reference to the accompanying drawings.

First Embodiment

Figure 1:
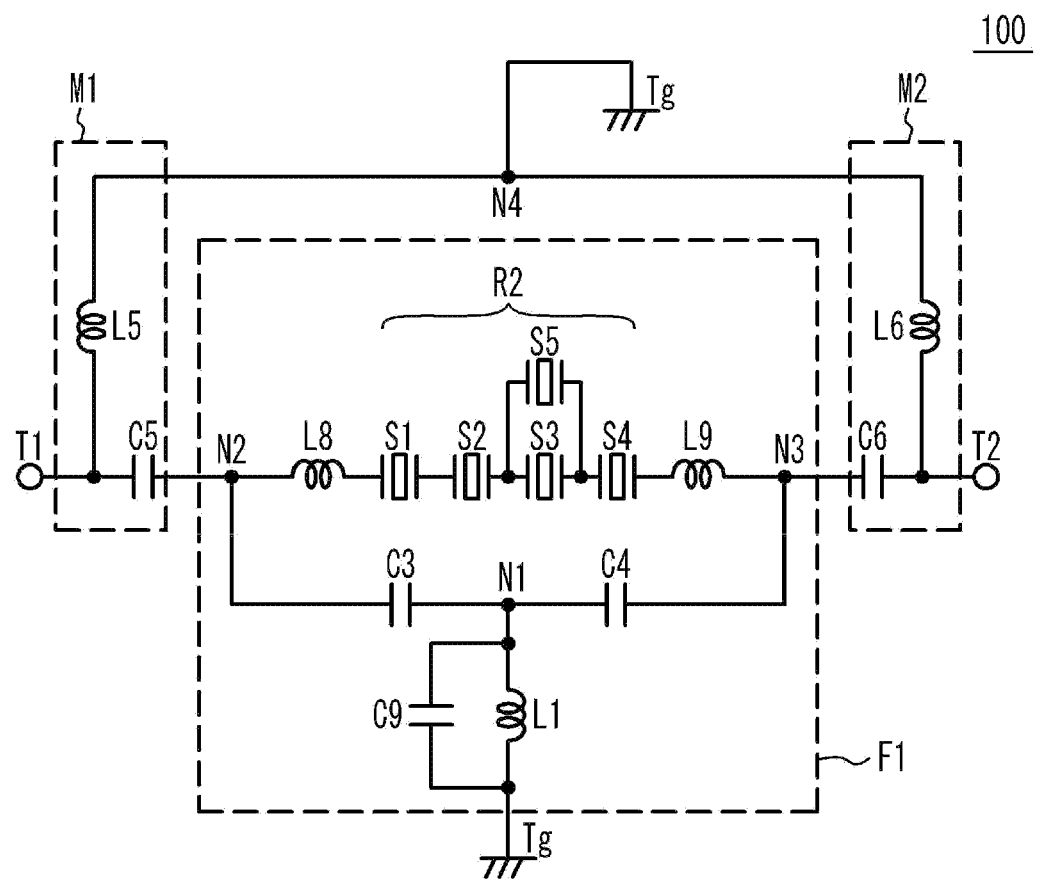
FIG. 1 is a circuit diagram of a filter in accordance with a first embodiment and a first comparative example.

FIG. 1 is a circuit diagram of a filter in accordance with a first embodiment and a first comparative example. As illustrated in FIG. 1, a filter 100 includes a filter circuit F1 and matching circuits M1 and M2. The filter circuit F1 is connected between a node N2 and a node N3. The matching circuit M1 is connected between a signal terminal T1 and the node N2. The matching circuit M2 is connected between a signal terminal T2 and the node N3.

The signal terminal T1 is an input terminal, while the signal terminal T2 is an output terminal. The filter circuit F1 is a high-pass filter. The filter circuit F1 allows signals in the passband among high-frequency signals input to the signal terminal T1 to pass therethrough, and suppresses signals in other bands. The matching circuit M1 matches the impedance when the filter circuit F1 is viewed from the signal terminal T1, with the reference impedance (for example, 50Ω), while the matching circuit M2 matches the impedance when the filter circuit F1 is viewed from the signal terminal T2, with the reference impedance (for example, 50Ω).

Two paths are provided in parallel between the nodes N2 and N3. One path includes capacitors C3 and C4 connected in series. An inductor L1 and a capacitor C9 are connected in parallel between a node N1, which is between the capacitors C3 and C4, and a ground terminal Tg. Another path between the nodes N2 and N3 includes an acoustic wave resonator R2. The acoustic wave resonator R2 includes acoustic wave resonators S1 to S4 connected in series and an acoustic wave resonator S5 connected in parallel to the acoustic wave resonator S3. An inductor L8 is connected between the acoustic wave resonator R2 and the node N2. An inductor L9 is connected between the acoustic wave resonator R2 and the node N3.

The matching circuit M1 includes an inductor L5 and a capacitor C5. The inductor L5 is connected between the signal terminal T1 and a node N4. The capacitor C5 is connected between the signal terminal T1 and the node N2. The matching circuit M2 includes an inductor L6 and a capacitor C6. The inductor L6 is connected between the signal terminal T2 and the node N4. The capacitor C6 is connected between the signal terminal T2 and the node N3. The node N4 is connected to the ground terminal Tg.

Figure 2A:
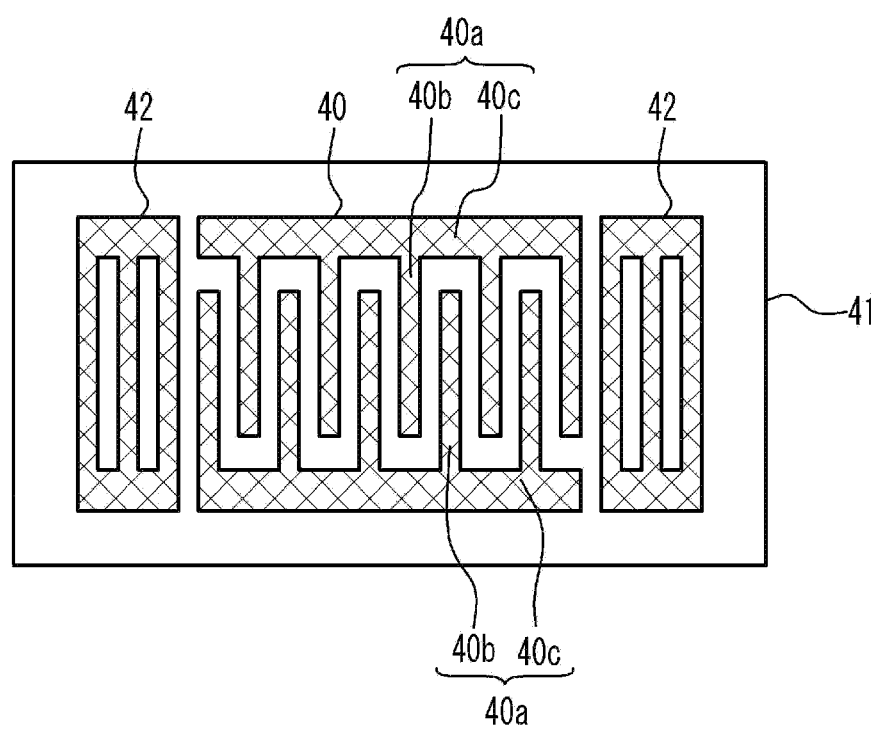
FIG. 2A is a plan view of an acoustic wave resonator in the first embodiment and the first comparative example.
Figure 2B:
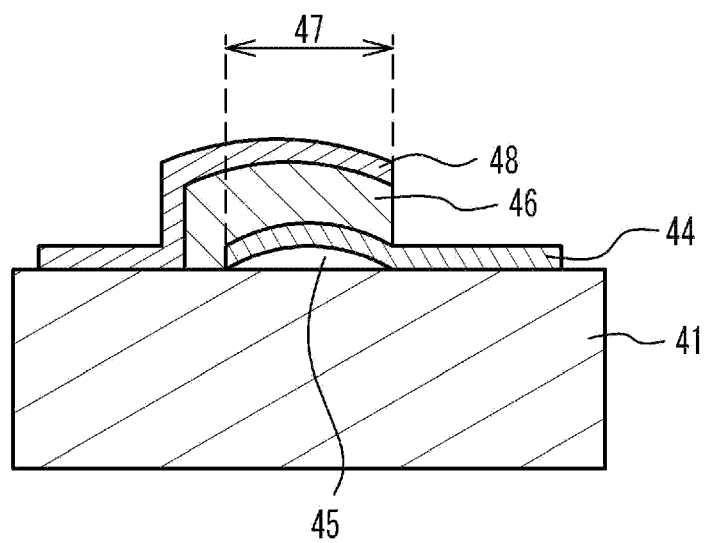
FIG. 2B is a cross-sectional view of another acoustic wave resonator in the first embodiment and the first comparative example.

FIG. 2A is a plan view of an acoustic wave resonator in the first embodiment and the first comparative example, and FIG. 2B is a cross-sectional view of another acoustic wave resonator in the first embodiment and the first comparative example. In the example of FIG. 2A, the acoustic wave resonator is a surface acoustic wave resonator. An interdigital transducer (IDT) 40 and reflectors 42 are located on the top surface of a substrate 41. The IDT 40 includes a pair of comb-shaped electrodes 40a opposite to each other. The comb-shaped electrode 40a includes a plurality of electrode fingers 40b and a bus bar 40c connecting the electrode fingers 40b. The reflectors 42 are located at both sides of the IDT 40. The IDT 40 excites the surface acoustic wave on the substrate 41. The substrate 41 is, for example, a piezoelectric substrate such as a lithium tantalate substrate, a lithium niobate substrate, or a crystalline quartz substrate. The substrate 41 may be a composite substrate having a structure designed to have a piezoelectric substrate bonded on a support substrate such as a sapphire substrate, a spinel substrate, an alumina substrate, a crystalline quartz substrate, or a silicon substrate. The IDT 40 and the reflectors 42 are formed of, for example, an aluminum film or a copper film. A protective film or a temperature compensation film may be provided on the substrate 41 so as to cover the IDT 40 and the reflectors 42.

In the example of FIG. 2B, the acoustic wave resonator is a piezoelectric thin film resonator. A piezoelectric film 46 is formed on the substrate 41. A lower electrode 44 and an upper electrode 48 are provided so as to sandwich the piezoelectric film 46 therebetween. An air gap 45 is formed between the lower electrode 44 and the substrate 41. The region where the lower electrode 44 and the upper electrode 48 are opposed to each other across at least a part of the piezoelectric film 46 is a resonance region 47. The lower electrode 44 and the upper electrode 48 within the resonance region 47 excite the acoustic wave in the thickness extension mode in the piezoelectric film 46. The substrate 41 is, for example, a sapphire substrate, a spinel substrate, an alumina substrate, a glass substrate, a crystalline quartz substrate, or a silicon substrate. The lower electrode 44 and the upper electrode 48 are formed of a metal film such as a ruthenium film. The piezoelectric film 46 is, for example, an aluminum nitride film. An acoustic mirror may be provided instead of the air gap 45.

Figure 3A:
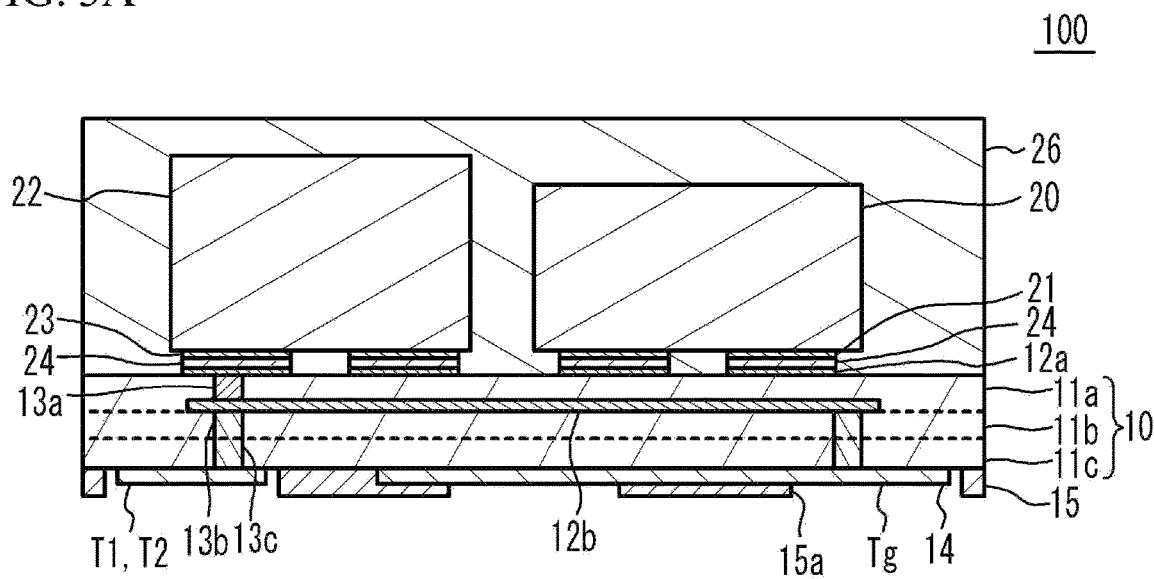
FIG. 3A and FIG. 3B are cross-sectional views of filters in accordance with the first embodiment and the first comparative example, respectively.
Figure 3B:
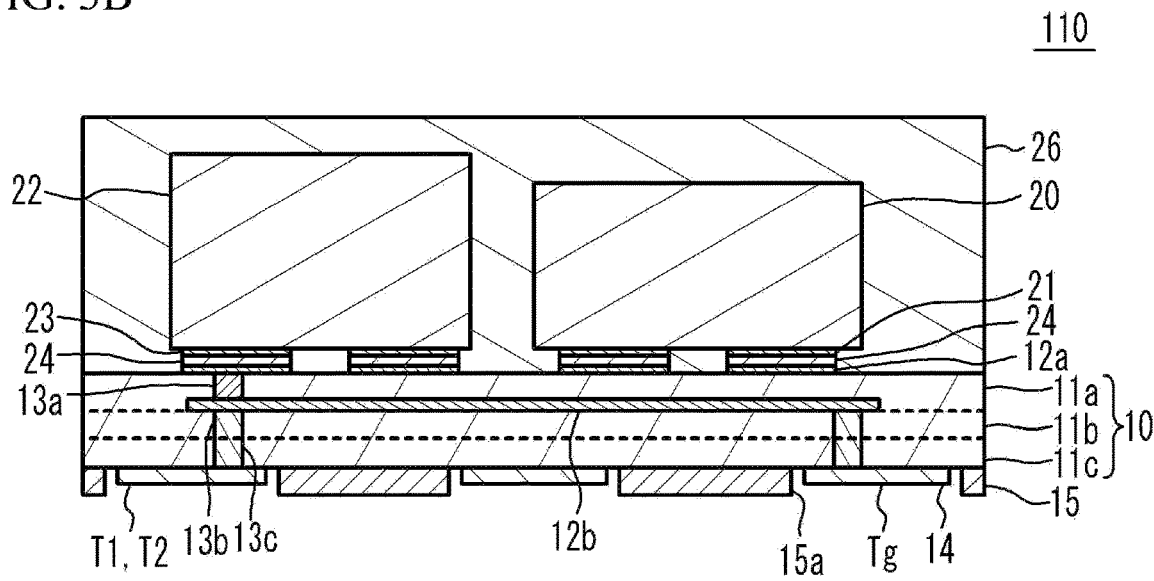

FIG. 3A and FIG. 3B are cross-sectional views of filters in accordance with the first embodiment and the first comparative example, respectively. As illustrated in FIG. 3A and FIG. 3B, electronic components 20 and 22 are mounted on a multilayered substrate 10 in the filter 100 of the first embodiment and a filter 110 of the first comparative example. The electronic component 20 is a component in which the acoustic wave resonator R2 is mounted. Terminals 21 are provided on the bottom surface of the electronic component 20. The electronic component 22 is a layered product having a structure designed to have dielectric layers such as ceramic layers stacked. The electronic component 22 includes the inductors and the capacitors other than the inductors L5 and L6 among the inductors and the capacitors illustrated in FIG. 1. Terminals 23 are provided on the bottom surface of the electronic component 22.

The multilayered substrate 10 includes insulating layers 11a to 11c that are stacked. The insulating layers 11a to 11c are made of, for example, resin such as glass epoxy resin, or ceramics such as low temperature co-fired ceramics (LTCC) or high temperature co-fired ceramics (HTCC). A metal layer 12a is provided on the upper surface of the insulating layer 11a, and a metal layer 12b is provided on the upper surface of the insulating layer 11b. Terminals 14 are provided on the lower surface of the insulating layer 11c. Via wirings 13a to 13c respectively penetrating through the insulating layers 11a to 11c are provided. The metal layers 12a and 12b, the via wirings 13a to 13c, and the terminals 14 are formed of metal layers such as, for example, copper layers, gold layers, or aluminum layers. A solder resist 15 having an aperture 15a is located on the lower surface of the insulating layer 11c. At least a part of the terminal 14 is exposed from the aperture 15a of the solder resist 15. The solder resist 15 is a resin layer made of epoxy resin or other resins. The terminals 14 include the signal terminals T1 and T2 and the ground terminal Tg.

The metal layer 12a on the top surface of the multilayered substrate 10 is connected to the terminals 21 on the bottom surface of the electronic component 20 and the terminals 23 on the bottom surface of the electronic component 22 by solder 24. A sealing portion 26 for sealing the electronic components 20 and 22 are located on the multilayered substrate 10. The sealing portion 26 is formed of a resin layer made of, for example, epoxy resin. The resin layer may contain an inorganic filler. A top plate, which is a metal plate or an insulating plate, may be provided over the electronic components 20 and 22 without providing the sealing portion 26.

FIG. 4A to FIG. 4E are plan views of the multilayered substrate in the first embodiment and the first comparative example. In FIG. 4A to FIG. 4E, the plan view of the multilayered substrate of the first embodiment is identical to the plan view of the multilayered substrate of the first comparative example. In addition, illustration of the metal layers and the via wirings other than the inductors L5 and L6 is omitted.

Figure 4A:
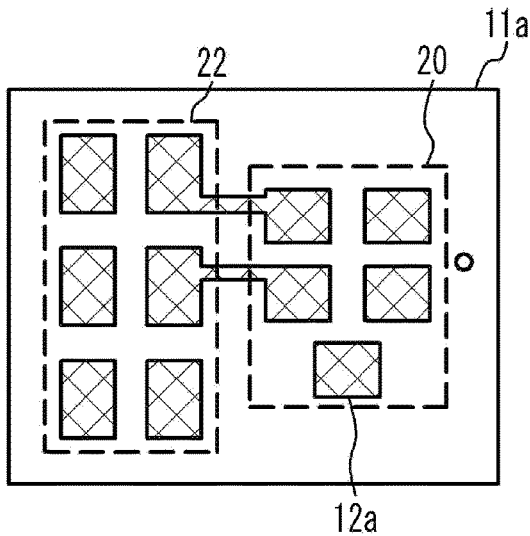
FIG. 4A to FIG. 4E are plan views of a multilayered substrate in the first embodiment and the first comparative example.
Figure 4B:
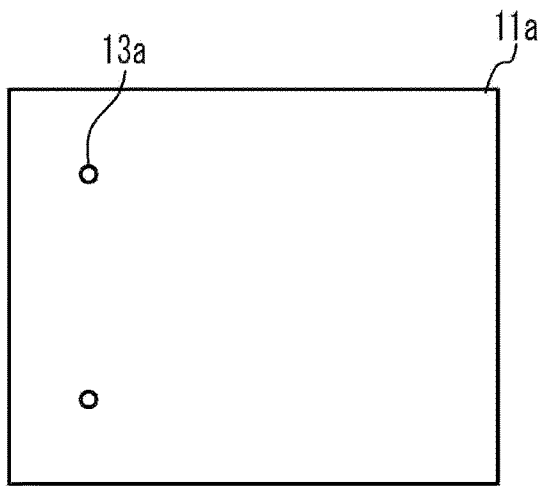
Figure 4C:
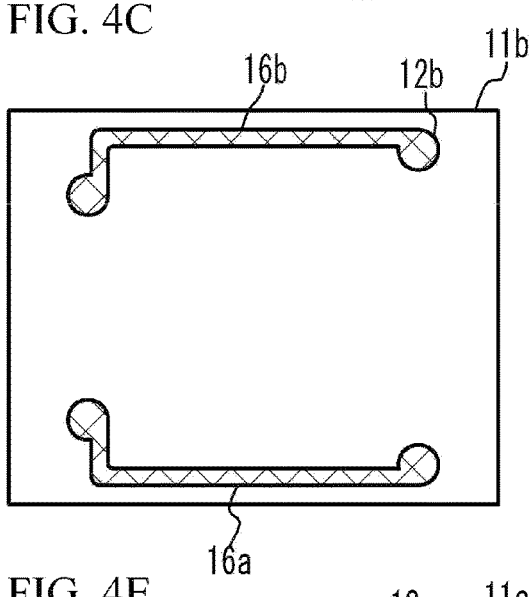
Figure 4D:
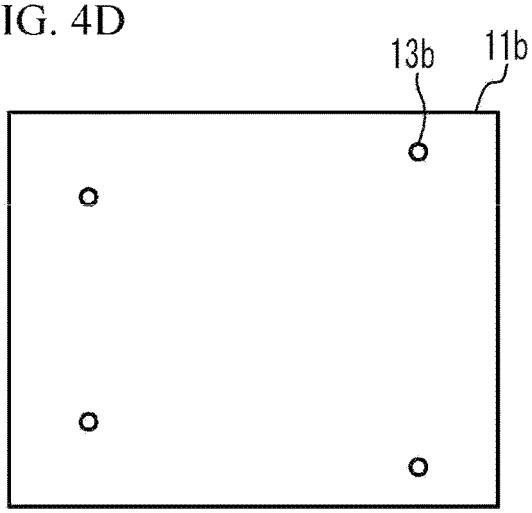
Figure 4E:
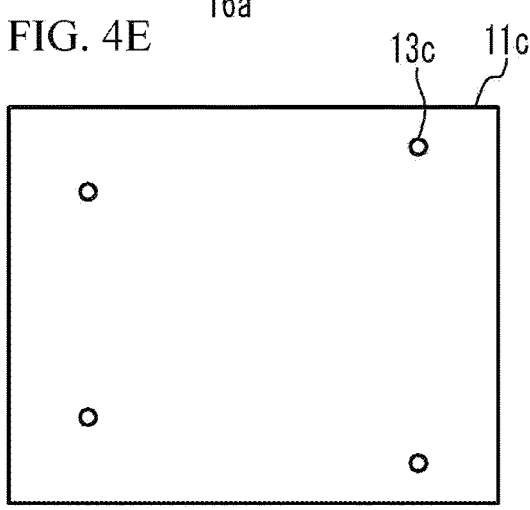

As illustrated in FIG. 4A, the metal layers 12a are located on the insulating layer 11a. The metal layers 12a act as the terminals to which the electronic components 20 and 22 are connected. As illustrated in FIG. 4B, the via wirings 13a penetrating through the insulating layer 11a are provided. As illustrated in FIG. 4C, the metal layers 12b are located on the insulating layer 11b. The metal layers 12b include a line 16a forming at least a part of the inductor L5 and a line 16b forming at least a part of the inductor L6. As illustrated in FIG. 4D, the via wirings 13b penetrating through the insulating layer 11b are provided. As illustrated in FIG. 4E, the via wirings 13c penetrating through the insulating layer 11c are provided.

Figure 5A:
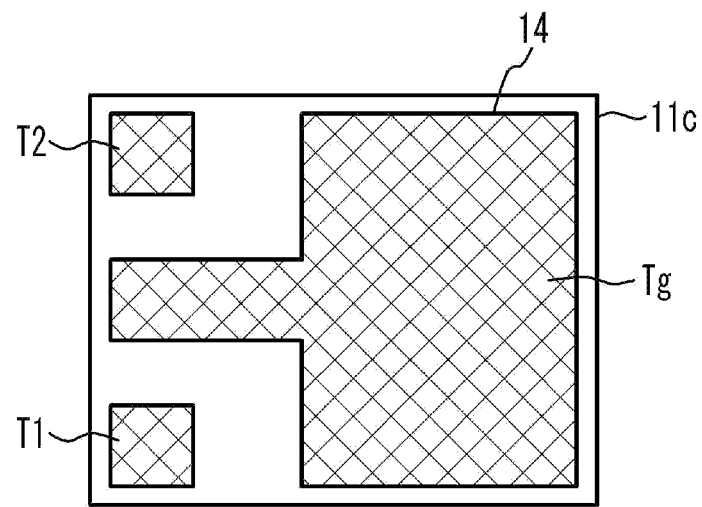
FIG. 5A and FIG. 5B are plan views of the multilayered substrates in the first embodiment and the first comparative example, respectively.
Figure 5B:
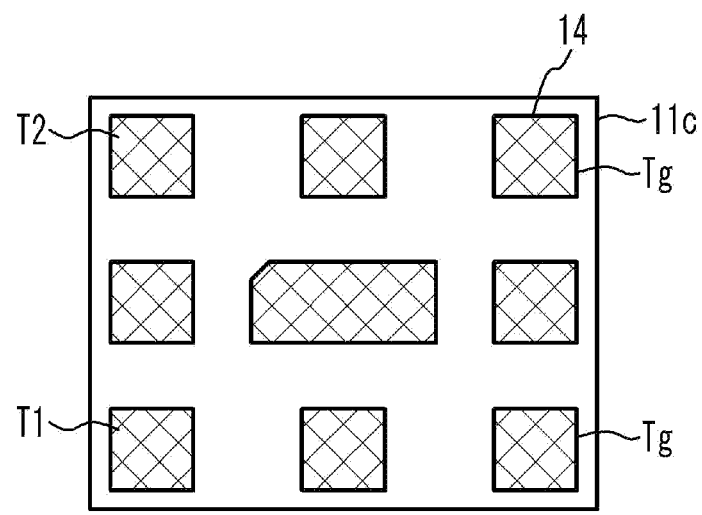

FIG. 5A and FIG. 5B are plan views of the multilayered substrates in the first embodiment and the first comparative example, respectively. FIG. 5A and FIG. 5B are plan views illustrating the bottom surface of the insulating layer 11c as viewed from above. As illustrated in FIG. 5A and FIG. 5B, the terminals 14 are located on the bottom surface of the insulating layer 11c. The signal terminals T1 and T2 and the ground terminals Tg are provided as the terminals 14.

As illustrated in FIG. 4A to FIG. 5B, a first end of the line 16a is electrically connected to the signal terminal T1 through the via wirings 13b and 13c, while a first end of the line 16b is electrically connected to the signal terminal T2 through the via wirings 13b and 13c. A second end of the line 16a is electrically connected to the ground terminal Tg through the via wirings 13b and 13c, while a second end of the line 16b is connected to the ground terminal Tg through the via wirings 13b and 13c. The first ends of the lines 16a and 16b are also electrically connected to the electronic component 22 through the via wiring 13a and the metal layer 12a.

As illustrated in FIG. 3A and FIG. 5A, in the filter 100 of the first embodiment, the ground terminal Tg is larger than the signal terminals T1 and T2, and overlaps with an approximately half part of each of the lines 16a and 16b in plan view. As illustrated in FIG. 3B and FIG. 5B, in the filter 110 of the first comparative example, the ground terminal Tg has approximately the same size as each of the signal terminals T1 and T2, and the ground terminal Tg overlaps little with each of the lines 16a and 16b.

In the first embodiment and the first comparative example, the filters 100 and 110 can be miniaturized by providing the line 16a, which forms at least a part of the inductor L5 of the matching circuit M1, and the line 16b, which forms at least a part of the inductor L6 of the matching circuit M2, in the multilayered substrate 10. However, the first comparative example has a problem described below.

Figure 6A:
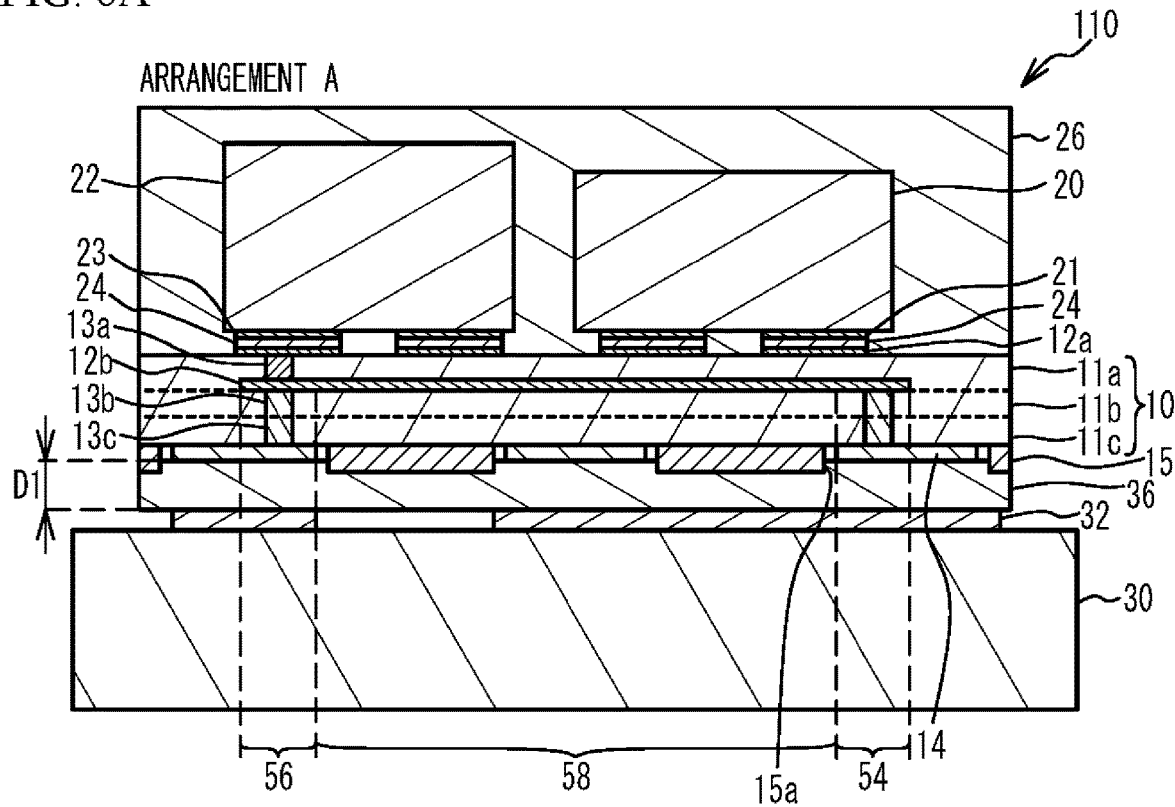
FIG. 6A and FIG. 6B are cross-sectional views illustrating the filter of the first comparative example mounted on a mounting board.
Figure 6B:
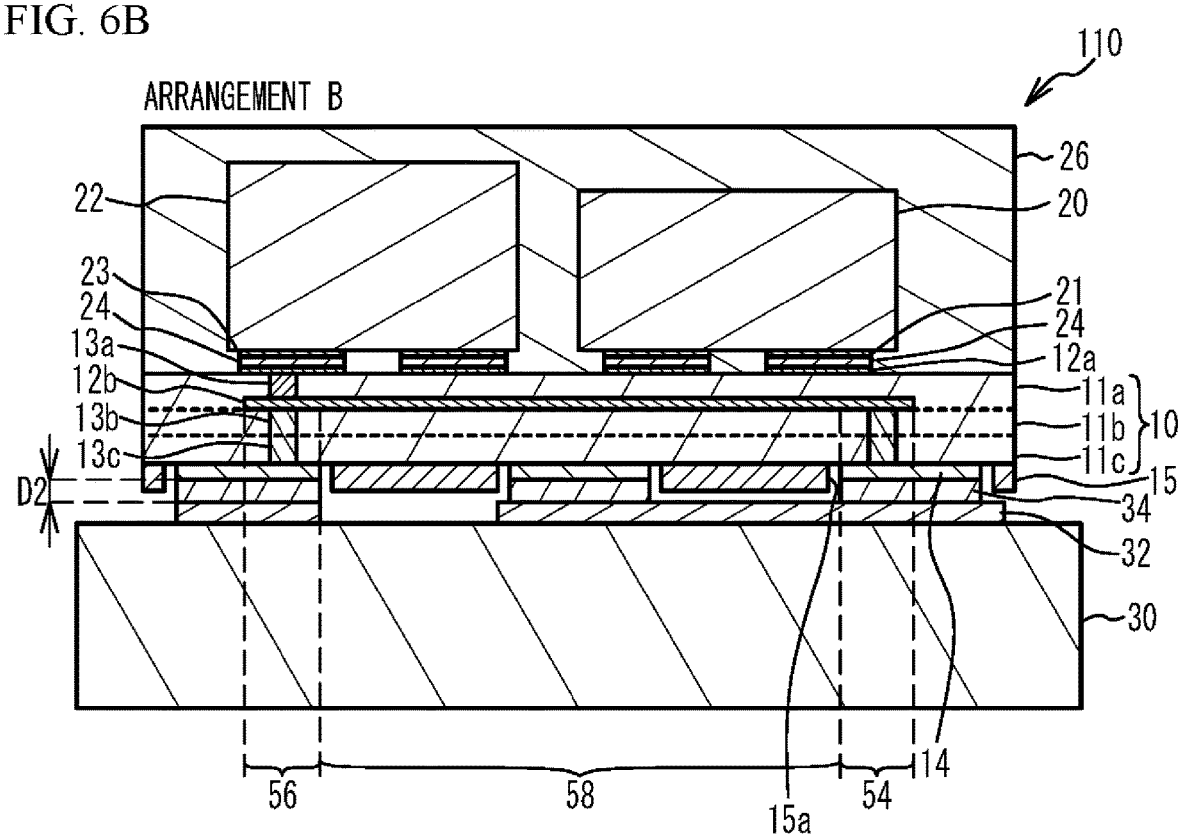

FIG. 6A and FIG. 6B are cross-sectional views illustrating the filter of the first comparative example mounted on a mounting board. The arrangement for measurement illustrated in FIG. 6A is defined as an arrangement A, and the arrangement for measurement illustrated in FIG. 6B is defined as an arrangement B. As illustrated in FIG. 6A, in the arrangement A, to inspect the filter 110 of the first comparative example, the filter 110 is mounted on a mounting board 30 through a conductive sheet 36. The terminals 14 of the filter 110 are electrically connected to terminals 32 on the mounting board 30 through the conductive sheet 36.

As illustrated in FIG. 6B, in the arrangement B, the filter 110 of the first comparative example is mounted on the mounting board 30 using solder 34. The terminal 14 of the filter 110 is electrically connected to the terminal 32 on the mounting board 30 through the solder 34.

The distance D1 between the bottom surface of the filter 110 and the top surface of the mounting board 30 in the arrangement A illustrated in FIG. 6A is greater than the distance D2 between the bottom surface of the filter 110 and the top surface of the mounting board 30 in the arrangement B illustrated in FIG. 6B. Therefore, the inductance between the terminal 14 and the terminal 32 in the arrangement A illustrated in FIG. 6A is greater than the inductance between the terminal 14 and the terminal 32 in the arrangement B illustrated in FIG. 6B. Thus, the inductances of the inductors L5 and L6 differ between the arrangement A and the arrangement B, which results in the difference between the filter characteristic in the arrangement A and the filter characteristic in the arrangement B.

Figure 7A:
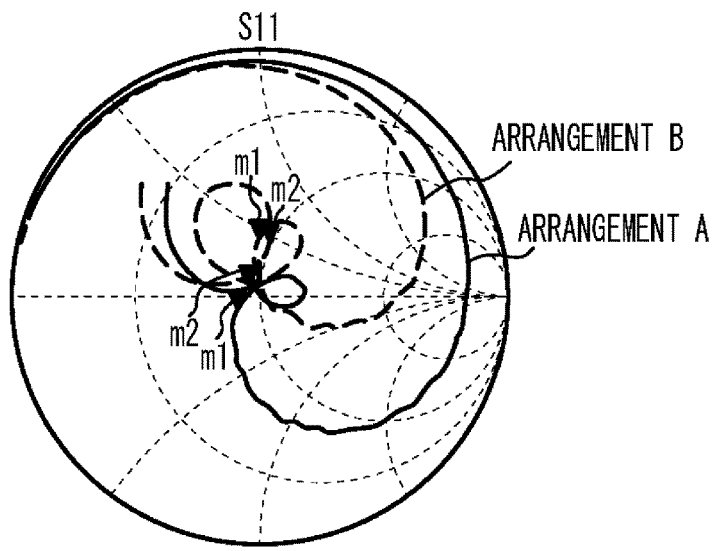
FIG. 7A to FIG. 7C illustrate filter characteristics in an arrangement A for measurement and an arrangement B for measurement in the first comparative example.
Figure 7B:
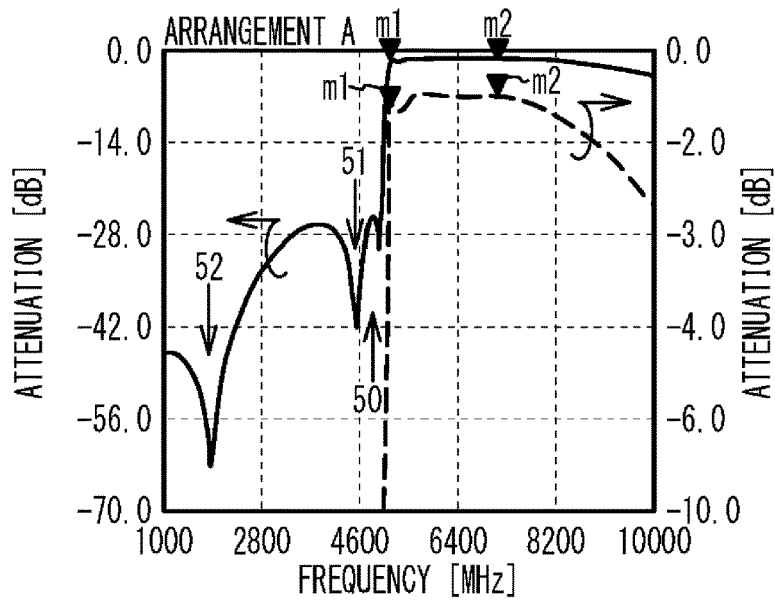
Figure 7C:
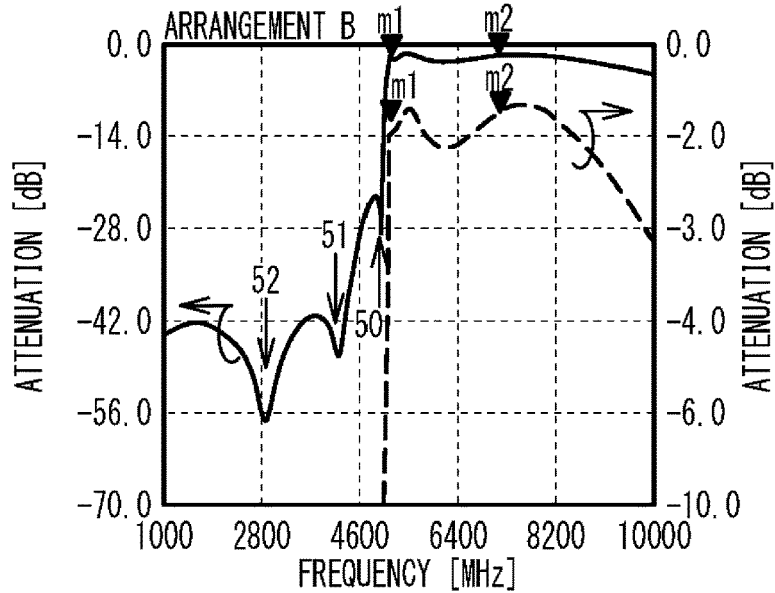

FIG. 7A to FIG. 7C illustrate filter characteristics in the arrangement A and the arrangement B in the first comparative example. FIG. 7A is a Smith chart illustrating the reflection characteristic S11 at the signal terminal T1 in each of the arrangements A and B. FIG. 7B illustrates the transmission characteristic S21 (attenuation) from the signal terminal T1 to the signal terminal T2 in the arrangement A, and FIG. 7C illustrates the transmission characteristic S21 (attenuation) from the signal terminal T1 to the signal terminal T2 in the arrangement B. In FIG. 7B and FIG. 7C, a dashed line corresponds to the scale of the vertical axis at the right side of the graph, and a solid line corresponds to the scale of the vertical axis at the left side of the graph. The dashed line indicates the enlarged attenuation of the solid line. Markers m1 and m2 indicate the passband. The marker m1 indicates 5150 MHz and the marker m2 indicates 7125 MHz. The characteristics from 1000 MHz to 10000 MHz were measured. The inductance and the capacitance of each element are approximately equal to those of a filter F in a simulation 2 described later.

As illustrated in FIG. 7A, at frequencies lower than the frequency indicated by the marker m1 (i.e., frequencies lower than the passband), the reflection characteristic in the arrangement A differs from the reflection characteristic in the arrangement B. The reflection characteristics between the frequencies indicated by the markers m1 and m2 (i.e., within the passband) approximately corresponds to the reference impedance.

As illustrated in FIG. 7B and FIG. 7C, three attenuation poles 50 to 52 having relative minima are formed at frequencies lower than the passband. The attenuation pole 50 is an attenuation pole formed mainly by the acoustic wave resonator R2. The attenuation pole 51 is an attenuation pole formed mainly by the filter circuit F1. The attenuation pole 52 is an attenuation pole formed by the filter circuit F1 and the matching circuits M1 and M2.

As illustrated in FIG. 7B and FIG. 7C, the attenuation pole 50 in the arrangement A differs little from the attenuation pole 50 in the arrangement B. The attenuation pole 51 in the arrangement A is formed at a frequency slightly higher than the frequency at which the attenuation pole 51 in the arrangement B is formed. The attenuation pole 52 in the arrangement A is formed at a frequency lower than the frequency at which the attenuation pole 52 in the arrangement B is formed. As seen above, since mainly the attenuation pole 52 in the arrangement A is formed at a frequency lower than the frequency at which the attenuation pole 52 in the arrangement B is formed, the attenuation around 4000 MHz is large.

As seen above, in the first comparative example, the change in the distance between the bottom surface of the multilayered substrate 10 and the top surface of the mounting board 30 largely changes the filter characteristic. Therefore, the filter characteristic obtained when the filter 110 is inspected differs from the filter characteristic obtained when the filter 110 is mounted on the mounting board 30 as described in FIG. 6A and FIG. 6B. The thickness of the solder 34 used to mount the filter 110 on the mounting board 30 also affects the filter characteristic.

Simulation 1

The inductance of the inductor L5 between the ground terminal Tg and the terminal 32 of the mounting board 30 was simulated for different sizes of the ground terminal Tg using the 3-dimensional finite element method. The total thickness of the insulating layers 11b and 11c was set at 85 and the relative permittivity of the insulating layers 11b and 11c was set at 4.4. The distance D1 in the arrangement A was set at 150 and the distance D2 in the arrangement B was set at 10 μm.

Figure 8A:
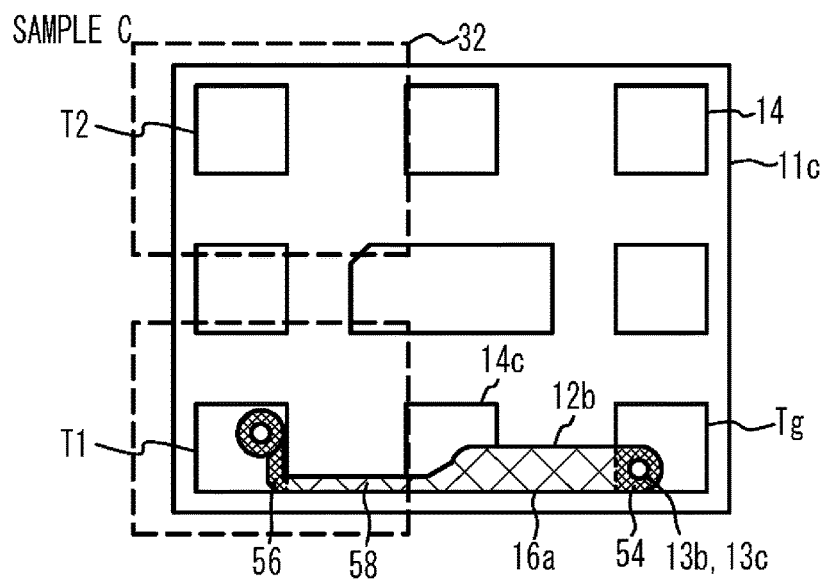
FIG. 8A to FIG. 8C are plan views of samples C to E in a simulation 1, respectively.
Figure 8B:
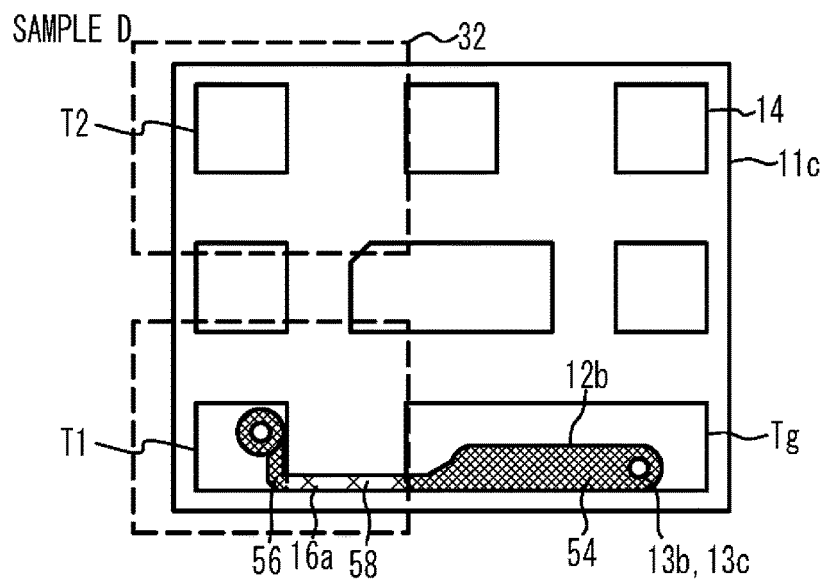
Figure 8C:
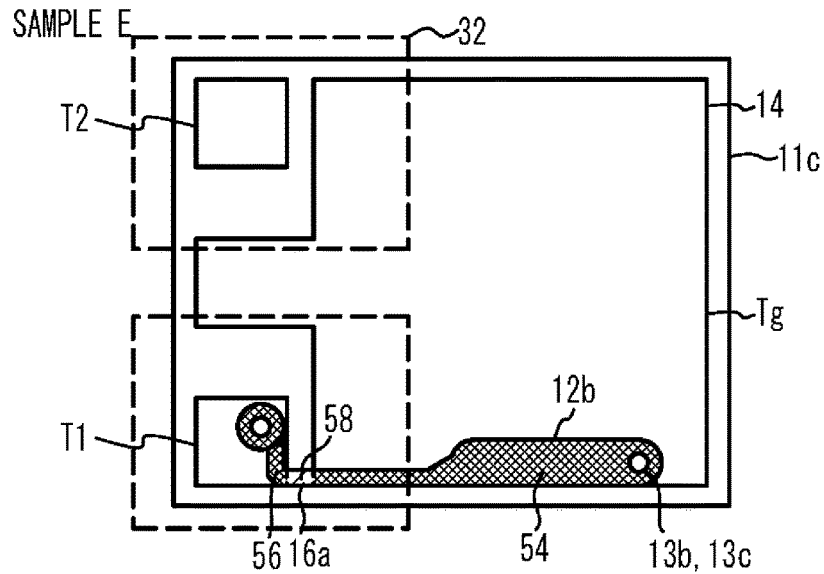

FIG. 8A to FIG. 8C are plan views of samples C to E in a simulation 1, respectively. In FIG. 8A to FIG. 8C, the insulating layer 11c, the metal layer 12b, the via wirings 13b and 13c, the terminals 14, the line 16a, and the terminals 32 are illustrated. A region 56, which overlaps with the signal terminal T1, of the line 16a and a region 54, which overlaps with the ground terminal Tg, of the line 16a are indicated by dense cross hatching. The sample C corresponds to the first comparative example, and the samples D and E correspond to the first embodiment.

As illustrated in FIG. 8A, in the sample C, the area of the ground terminal Tg in plan view is approximately equal to the area of the signal terminal T1 in plan view. The region 54 is a region where the line 16a overlaps in plan view with the ground terminal Tg to which the line 16a is connected through the via wirings 13b and 13c. The region 56 is a region where the line 16a overlaps in plan view with the signal terminal T1 to which the line 16a is connected through the via wirings 13b and 13c. A region 58 is a region other than the regions 54 and 56 of the metal layer 12b. The area of the region 54 is approximately equal to the area of the region 56. Although the metal layer 12b overlaps with the terminal 14c in the center part of the line 16a, the metal layer 12b is not electrically connected to the terminal 14c in the filter.

As illustrated in FIG. 8B, in the sample D, the area of the region 54, which overlaps with the ground terminal Tg, of the line 16a in plan view is greater than the area of the region 56, which overlaps with the signal terminal T1, of the line 16a in plan view. The area of the region 54 in plan view is equal to or greater than the half of the area of the metal layer 12b in plan view.

As illustrated in FIG. 8C, the area of the region 54, which overlaps with the ground terminal Tg, of the line 16a in plan view in the sample E is greater than that in the sample D. The ground terminal Tg is expanded to the region other than the signal terminals T1 and T2 on the lower surface of the insulating layer 11c. The area of the region 54 in plan view is equal to or greater than 80% of the metal layer 12b.

Figure 9A:
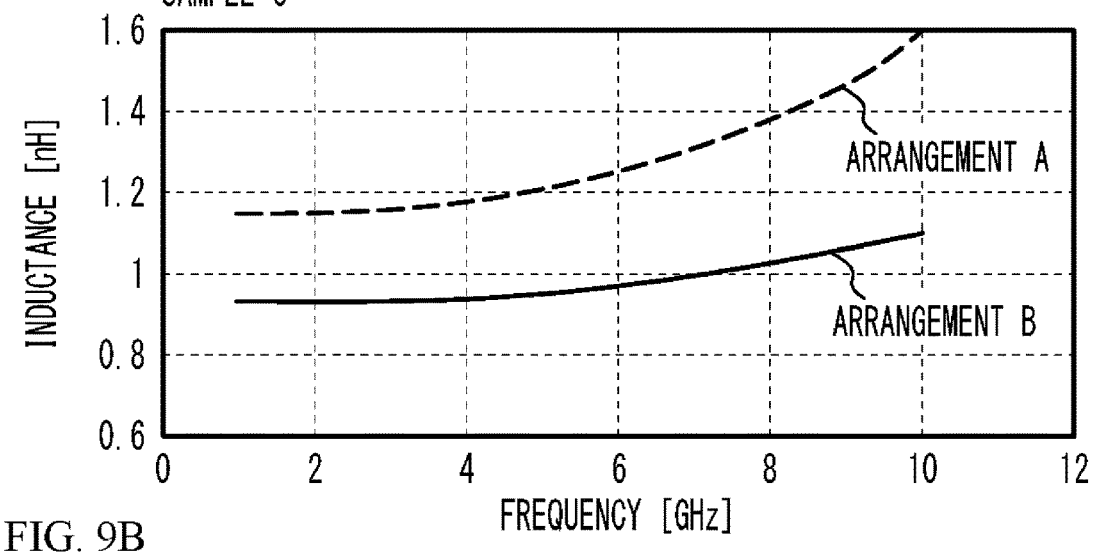
FIG. 9A to FIG. 9C are graphs of inductance versus frequency in the samples C to E in the simulation 1, respectively.
Figure 9B:
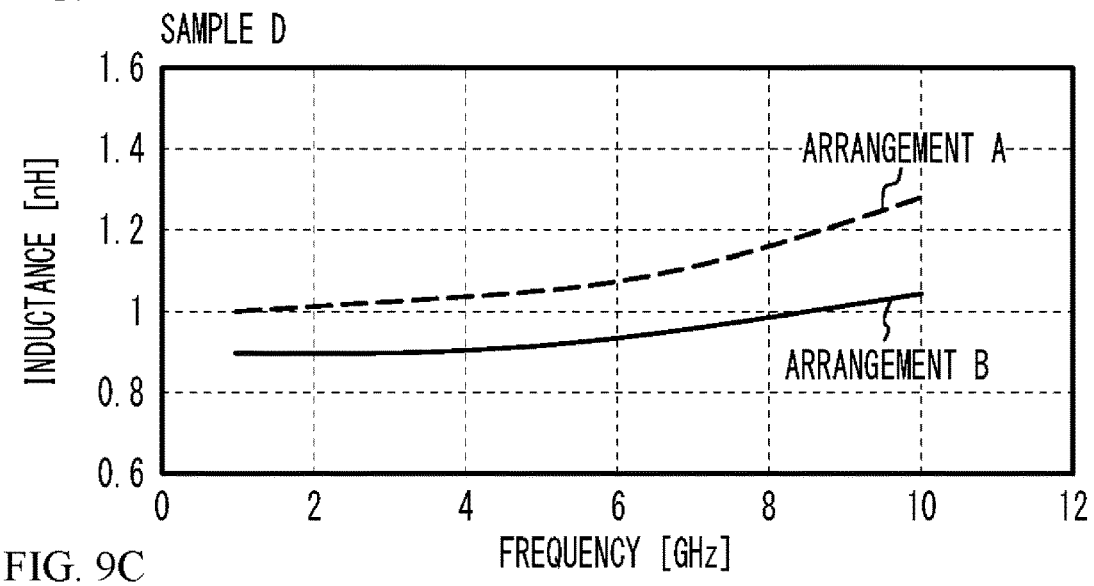
Figure 9C:
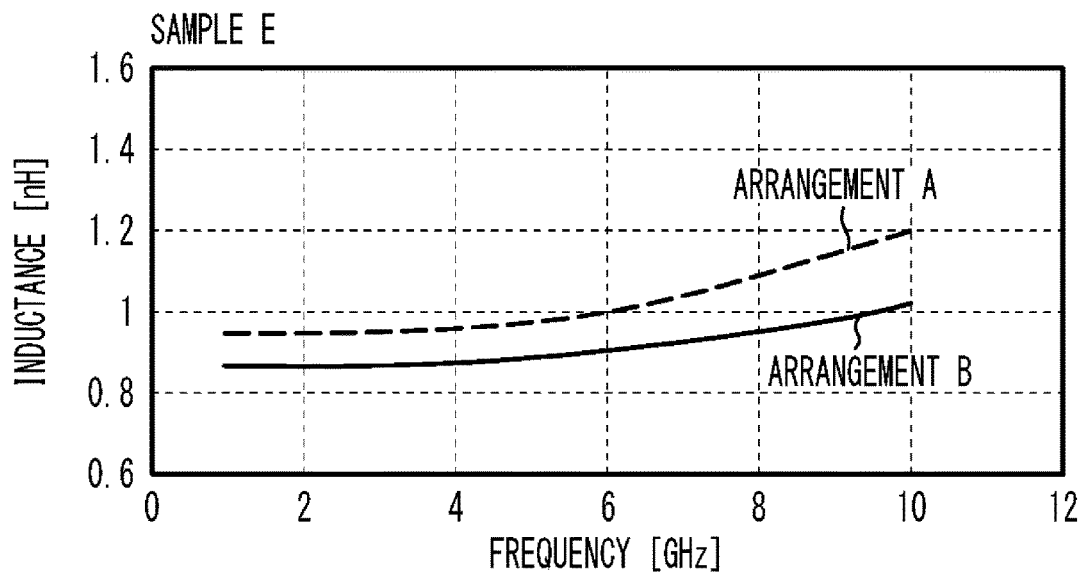

FIG. 9A to FIG. 9C are graphs of inductance versus frequency in the samples C to E in the simulation 1, respectively. As illustrated in FIG. 9A, in the sample C, the inductance in the arrangement A is greater than the inductance in the arrangement B. At 6 GHz, the inductance in the arrangement A is 1.25 nH, while the inductance in the arrangement B is 0.97 nH. The ratio of the inductance in the arrangement A to the inductance in the arrangement B is 129%.

As illustrated in FIG. 9B, in the sample D, the difference between the inductance in the arrangement A and the inductance in the arrangement B is less than that in the sample C. At 6 GHz, the inductance in the arrangement A is 1.07 nH, while the inductance in the arrangement B is 0.93 nH. The ratio of the inductance in the arrangement A to the inductance in the arrangement B is 116%. As illustrated in FIG. 9C, in the sample E, the difference between the inductance in the arrangement A and the inductance in the arrangement B is less than that in the sample D. At 6 GHz, the inductance of the arrangement A is 1.01 nH, while the inductance in the arrangement B is 0.91 nH. The ratio of the inductance in the arrangement A to the inductance in the arrangement B is 111%.

As seen above, as the area of the region 54 is increased, the difference between the inductance in the arrangement A and the inductance in the arrangement B decreases.

Figure 10A:
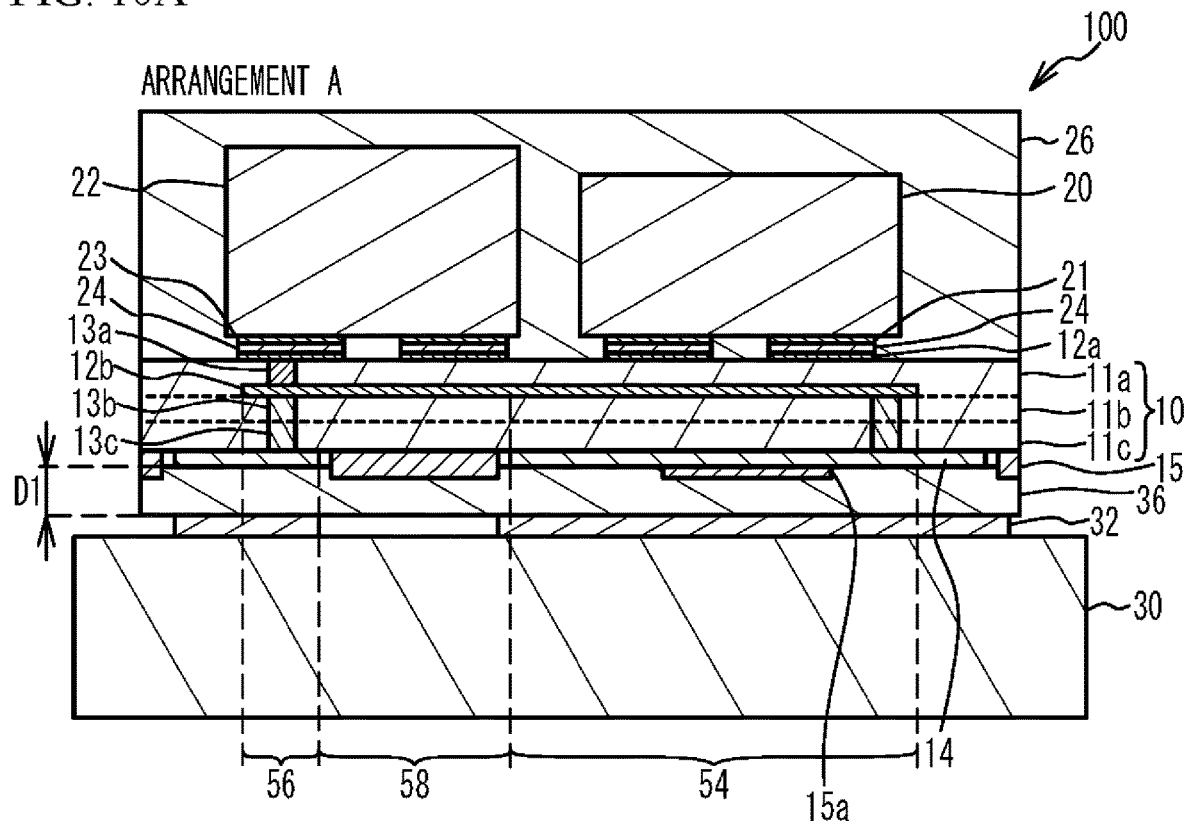
FIG. 10A and FIG. 10B are cross-sectional views illustrating the filter of the first embodiment mounted on a mounting board.
Figure 10B:
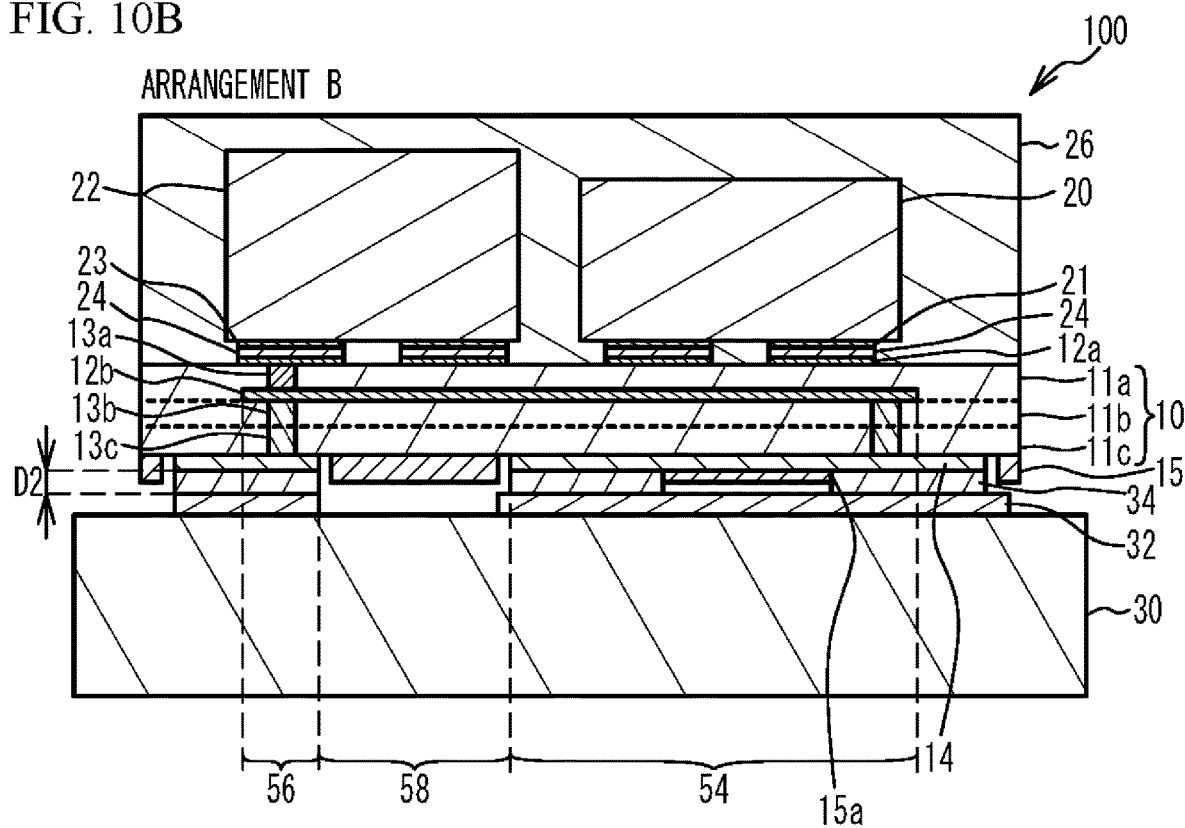

FIG. 10A and FIG. 10B are cross-sectional views illustrating the filter of the first embodiment mounted on a mounting board. In FIG. 10A and FIG. 10B, the region 54 where the ground terminal Tg overlaps with the metal layer 12b is larger than the region 54 of the first comparative example illustrated in FIG. 6A and FIG. 6B. It is considered that as the region 54 becomes larger, the effect of the difference between the distance D1 between the terminals 14 and 32 and the distance D2 between the terminals 14 and 32 on the inductor L5 decreases.

Figure 11A:
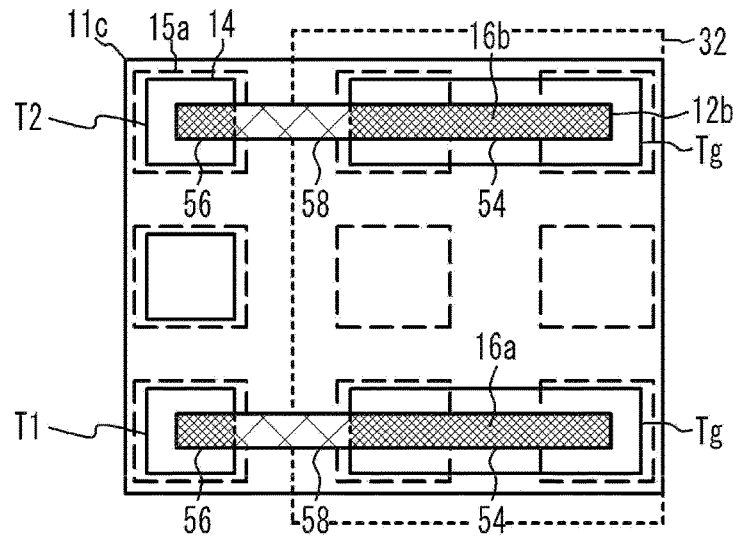
FIG. 11A to FIG. 11C are plan views of filters in accordance with first to third variations of the first embodiment.
Figure 11B:
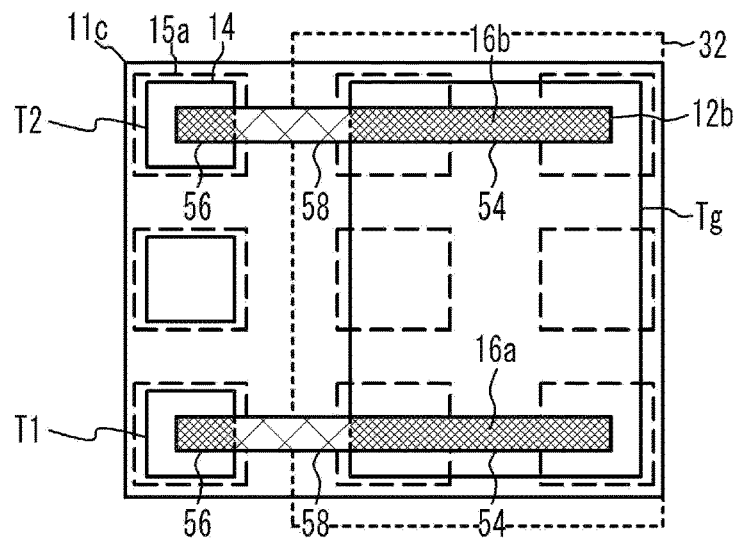
Figure 11C:
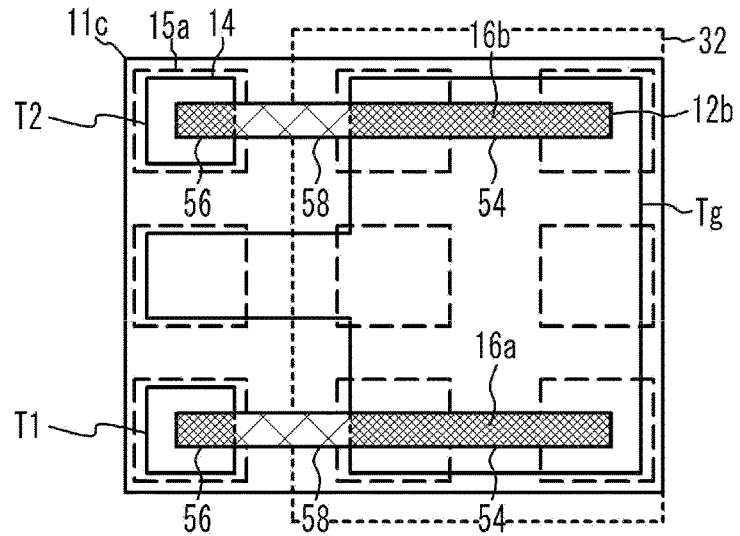

FIG. 11A to FIG. 11C are plan views of filters in accordance with first to third variations of the first embodiment. FIG. 11A to FIG. 11C mainly illustrate the insulating layer 11c, the metal layers 12b, the terminals 14, the apertures 15a of the solder resist 15, the lines 16a and 16b, and the terminals 32.

First Variation of the First Embodiment

As illustrated in FIG. 11A, in the first variation of the first embodiment, the line 16a forming at least a part of the inductor L5 and the line 16b forming at least a part of the inductor L6 are provided. In both the lines 16a and 16b, the area of the region 54 in plan view is equal to or greater than 50% of the area of the metal layer 12b in plan view. Two ground terminals Tg to which the lines 16a and 16b are respectively connected are separately provided. Other structures are the same as those in the first embodiment, and the description thereof is thus omitted.

Second Variation of the First Embodiment

As illustrated in FIG. 11B, in the second variation of the first embodiment, the lines 16a and 16b are connected to the same ground terminal Tg. Other structures are the same as those in the first variation of the first embodiment, and the description thereof is thus omitted.

Third Variation of the First Embodiment

As illustrated in FIG. 11C, in the third variation of the first embodiment, the ground terminal Tg is located between the signal terminals T1 and T2. Other structures are the same as those in the second variation of the first embodiment, and the description thereof is thus omitted.

In the first embodiment and the variations thereof, the filter circuit F1 is connected between the signal terminal T1 (a first signal terminal) and the signal terminal T2 (a second signal terminal). The signal terminals T1 and T2 and the ground terminal Tg are located on the bottom surface (a first surface) of the multilayered substrate 10 (a substrate), and the electronic components 20 and 22 forming the filter circuit F1 are located at the side of the top surface (a second surface of the substrate opposite from the first surface), i.e., on the top surface of the multilayered substrate 10 or above the multilayered substrate 10. The line 16a (a first line) is located in the multilayered substrate 10, a first end of the line 16a is connected to the signal terminal T1, and a second end of the line 16a is connected to the ground terminal Tg (a first ground terminal). The area of the region where the line 16a overlaps with the ground terminal Tg is greater than the area of the region where the line 16a overlaps with the signal terminal T1 when the multilayered substrate 10 is viewed in plan view. This structure reduces the dependence of the filter characteristic on the distance between the mounting board 30 and the multilayered substrate 10.

The case where the filter circuit F1 is located at the top surface side of the multilayered substrate 10 is described, but a part of the filter circuit F1 (for example, a part of the capacitor, a part of the inductor, or a part of the capacitor and a part of the inductor) may be located in the multilayered substrate 10. That is, it is sufficient if at least a part of the filter circuit F1 is located at the top surface side of the multilayered substrate 10. In this case, the lines 16a and 16b are located closer to the bottom surface of the multilayered substrate 10 than the filter circuit F1 is. It is preferable that other capacitors, other inductors, and other lines are not provided between the line 16a and the bottom surface of the multilayered substrate 10 or between the line 16b and the bottom surface of the multilayered substrate 10. The case where the lines 16a and 16b are provided is described, but it is sufficient if one of the lines 16a and 16b is provided.

In the first variation of the first embodiment, a plurality of the lines 16a and 16b is provided, and a plurality of the ground terminals Tg is separately provided so as to correspond to the lines 16a and 16b, and each of the ground terminals Tg is connected to the corresponding one of the lines 16a and 16b. In this case, the line 16a, which is one of the lines, is connected to the signal terminal T1, and the area of the region where the line 16a overlaps with the corresponding ground terminal Tg is greater than the area of the region where the line 16a overlaps with the signal terminal T1 when the multilayered substrate 10 is viewed in plan view. In addition, the line 16b, which is another one of the lines, is connected to the signal terminal T2, and the area of the region where the line 16b overlaps with the corresponding ground terminal Tg is greater than the area of the region where the line 16b overlaps with the signal terminal T2 when the multilayered substrate 10 is viewed in plan view. This structure reduces the dependence of the filter characteristic on the distance between the mounting board 30 and the multilayered substrate 10.

As described in the results of the simulation 1, as the area of the region 54 increases, the change in the filter characteristic due to the change in the distance between the mounting board 30 and the multilayered substrate 10 is decreased. Therefore, in at least one of the lines 16a and 16b, the area of the region 54 is preferably equal to or greater than 2 times the area of the region 56, more preferably equal to or greater than 5 times the area of the region 56, further preferably equal to or greater than 10 times the area of the region 56. In addition, the area of the region 54 in plan view is preferably equal to or greater than 50% of the area of the line 16a in plan view, more preferably equal to or greater than 80% of the area of the line 16a in plan view.

The case where the signal terminals T1 and T2 are the input terminal and the output terminal, respectively is described, but the signal terminals T1 and T2 may be the output terminal and the input terminal, respectively.

In the second and third variations of the first embodiment, the line 16a, which is one of the lines, connects the signal terminal T1 to the ground terminal Tg, and the area of the region where the line 16a overlaps with the ground terminal Tg is greater than the area of the region where the line 16a overlaps with the signal terminal T1 when the multilayered substrate 10 is viewed in plan view. The line 16b connects the signal terminal T2 to the ground terminal Tg, and the area of the region where the line 16b overlaps with the ground terminal Tg is greater than the area of the region where the line 16b overlaps with the signal terminal T2 when the multilayered substrate 10 is viewed in plan view. This structure forms an inductor L7 in a filter G of a second embodiment described later between the ground terminal Tg and the terminal 32 of the mounting board 30. Therefore, the attenuation characteristic in the attenuation band is improved as described later.

The circuit configuration of the filter circuit F1 is not limited to the first embodiment, but the filter circuit F1 preferably includes the acoustic wave resonator R2 connected between the signal terminals T1 and T2, the inductor, and the capacitor.

Other Circuit Configurations

Figure 12A:
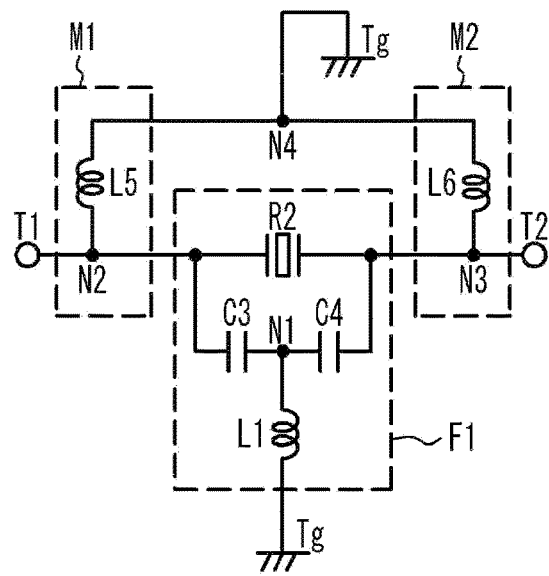
FIG. 12A to FIG. 12D are circuit diagrams illustrating other circuit configurations of the first embodiment.

FIG. 12A to FIG. 12D are circuit diagrams illustrating other circuit configurations of the first embodiment. As illustrated in FIG. 12A, the inductors L8 and L9 and the capacitors C5, C6, and C9 may be omitted. When an element having a first end connected to a ground and a second end connected to the node N1 is defined a first element, an element connected between the signal terminal T1 and the signal terminal T2 is defined as a second element, an element connected in parallel to the second element between the signal terminals T1 and T2 is defined as a third element, and an element connected in series with the third element and connected in parallel to the second element between the signal terminals T1 and T2 is defined as a fourth element, the first element is the inductor L1, the second element is the acoustic wave resonator R2, the third element is the capacitor C3, and the fourth element is the capacitor C4. Other circuit configurations are the same as those in FIG. 1, and the description thereof is thus omitted.

Figure 12B:
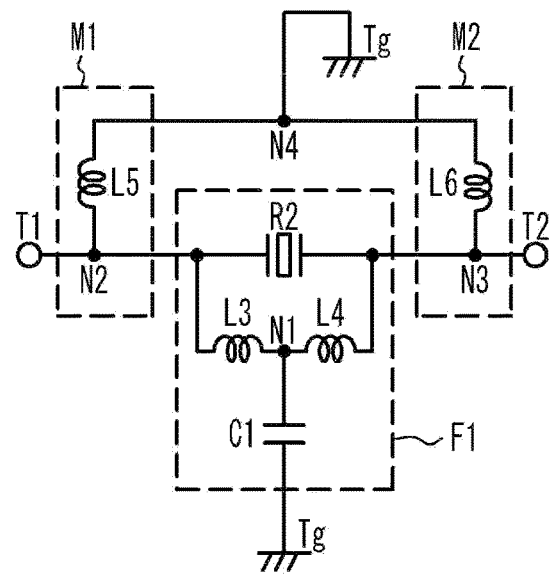
Figure 12C:
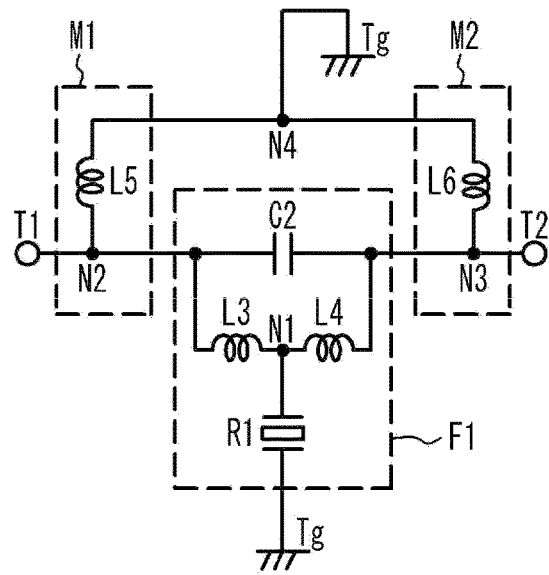
Figure 12D:
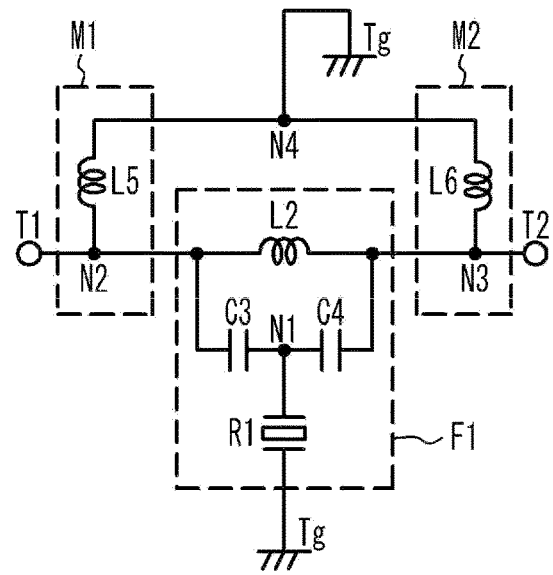

As illustrated in FIG. 12B, the first element may be the capacitor C1, the second element may be the acoustic wave resonator R2, the third element may be the inductor L3, and the fourth element may be the inductor L4. As illustrated in FIG. 12C, the first element may be an acoustic wave resonator R1, the second element may be the capacitor C2, the third element may be the inductor L3, and the fourth element may be the inductor L4. As illustrated in FIG. 12D, the first element may be the acoustic wave resonator R1, the second element may be the inductor L2, the third element may be the capacitor C3, and the fourth element may be the capacitor C4.

As seen above, the first element is selected from a group consisting of the acoustic wave resonator R1, the inductor L1, and the capacitor C1. The second element is selected from the inductor L2 and the capacitor C2 when the first element is the acoustic wave resonator R1, and is the acoustic wave resonator R2 when the first element is the inductor L1 or the capacitor C1. The third element is selected from the inductor L3 and the capacitor C3, and the type of the third element differs from the type of the first element when the inductor or the capacitor is selected as the first element and differs from the type of the second element when the inductor or the capacitor is selected as the second element. The fourth element is selected from the inductor L4 and the capacitor C4, and the type of the fourth element is identical to the type of the third element.

As illustrated in FIG. 7B and FIG. 7C, the transmission characteristic of the filter has the attenuation pole 50 (a first attenuation pole) formed by one or more acoustic wave resonators R1 or R2, the attenuation pole 51 (a second attenuation pole) formed by the filter circuit F1, and the attenuation pole 52 (a third attenuation pole) formed by the filter circuit F1 and the lines 16a and 16b. The attenuation poles 50 to 52 are formed at frequencies lower than the passband. The attenuation pole 51 is formed between the attenuation pole 52 and the passband, and the attenuation pole 50 is formed between the attenuation pole 51 and the passband. As seen above, the acoustic wave resonator R1 or R2 increases the steepness of the attenuation between the passband and the attenuation band. In such a filter, variation in the frequency of the attenuation pole 52 is likely to vary the attenuation characteristic of the filter. Thus, the region 54 is preferably larger than the region 56.

The first embodiment and the variations thereof describe a case where the filter 100 is a high-pass filter, as an example, but the filter 100 may be a low-pass filter or a bandpass filter. In the low-pass filter, the attenuation poles 50 to 52 are located at frequencies higher than the passband. The inductors L5 and L6 respectively used as the matching circuits M1 and M2 are likely to form the attenuation pole 52 at a low frequency. Therefore, the filter 100 is preferably a high-pass filter.

The acoustic wave resonator R2 may be one acoustic wave resonator, or may be two or more acoustic wave resonators as illustrated in FIG. 1.

Second Embodiment

Simulation 2

Figure 13A:
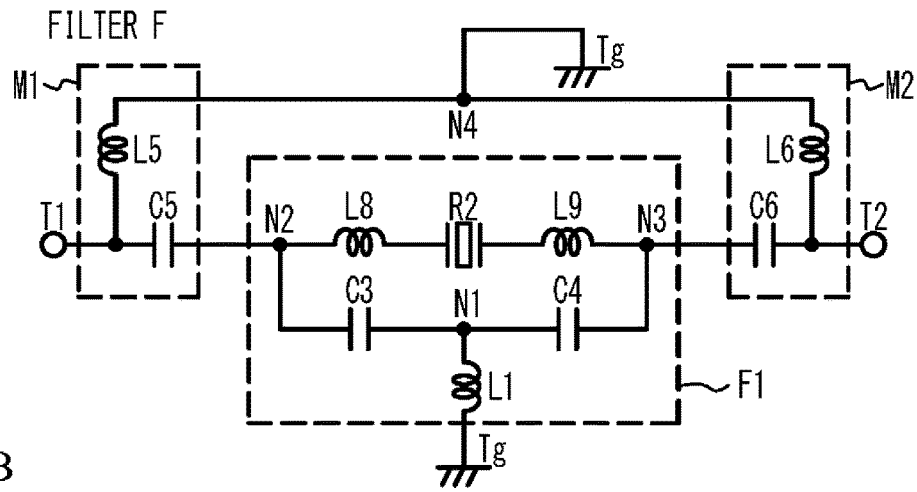
FIG. 13A to FIG. 13C are circuit diagrams of filters F, G, and H in a simulation 2, respectively.
Figure 13B:
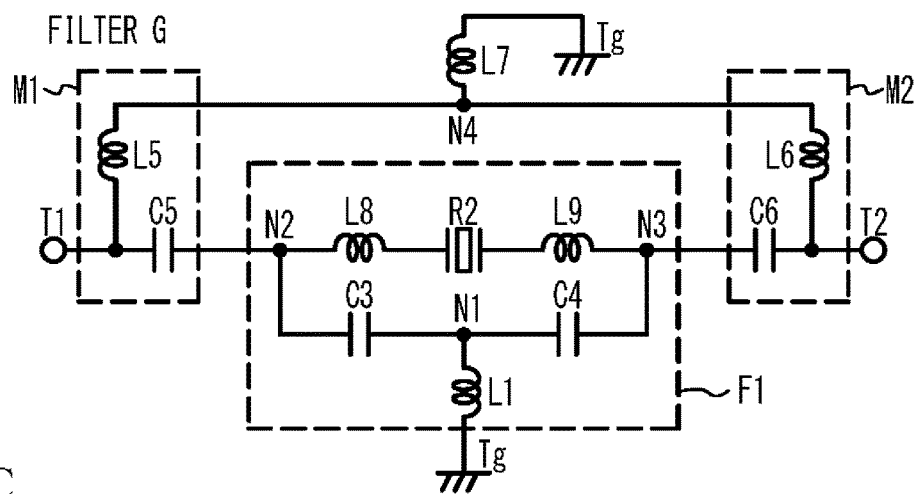
Figure 13C:
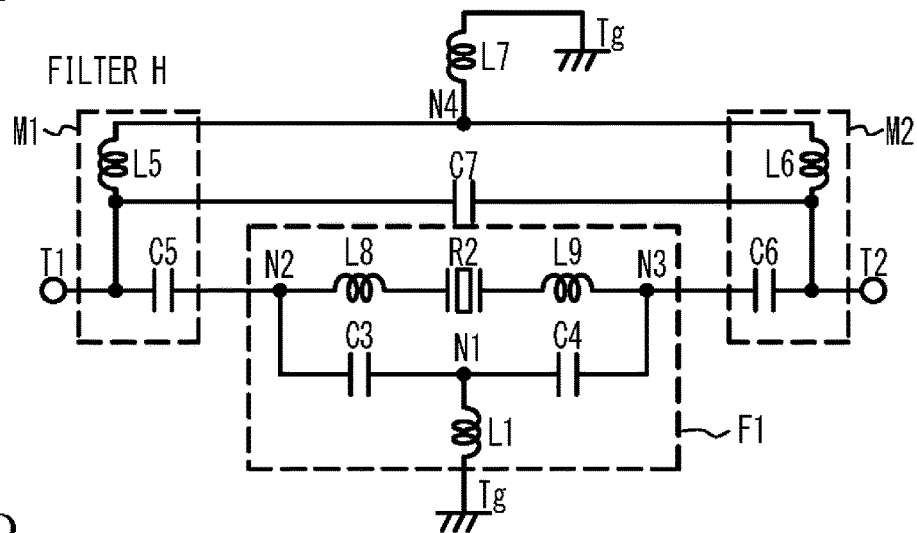

A filter of the second embodiment was simulated. FIG. 13A to FIG. 13C are circuit diagrams of filters F, G, and H in a simulation 2. The filter F corresponds to a second comparative example, and the filters G and H correspond to the second embodiment.

As illustrated in FIG. 13A, in the filter F, the configuration is the same as the configuration illustrated in FIG. 1 except that the acoustic wave resonator R2 in FIG. 1 is constructed of one acoustic wave resonator R2, and the description thereof is thus omitted. As illustrated in FIG. 13B, in the filter G, the inductor L7 is connected between the node N4 and the ground terminal Tg. Other circuit configurations are the same as those of the filter F, and the description thereof is thus omitted. As illustrated in FIG. 13C, in the filter H, a capacitor C7 is connected in parallel to the filter circuit F1 between the signal terminals T1 and T2.

The capacitances of the capacitors C5 and C6 in the filter F were set at 1.8 pF. In the filter G, the capacitances of the capacitors C5 and C6 were set at 2.1 pF when the inductance of the inductor L7 was 0.05 nH, and the capacitances of the capacitors C5 and C6 were set at 2.2 pF when the inductance of the inductor L7 was 0.12 nH. In the filter H, the capacitances of the capacitors C5 and C6 were set at 2.5 pF, the inductance of the inductor L7 was set at 0.12 nH, and the capacitance of the capacitor C7 was set at 0.06 pF. The inductances of the inductors L5 and L6 in the filters F, G, and H were set at 1.3 nH. The capacitances of other capacitors and the inductances of other inductors were set so that the desired attenuation characteristic was obtained, and were set at approximately the same values among the filters F, G, and H.

Figure 13D:
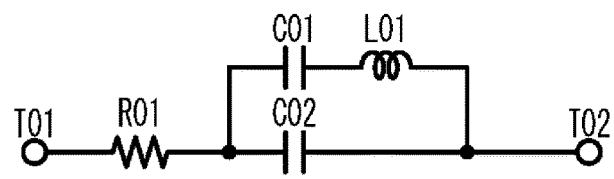
FIG. 13D illustrates an equivalent circuit of an acoustic wave resonator in the simulation 2.

FIG. 13D illustrates an equivalent circuit of the acoustic wave resonator in the simulation 2. As illustrated in FIG. 13D, a resistor R01 and a capacitor C02 are connected in series and a capacitor C01 and an inductor L01 are connected in parallel to the capacitor C02 between ends T01 and T02 of the acoustic wave resonator R2. In the simulation 2, the resistance of the resistor R01 was set at 5 S2, the capacitance of the capacitor C01 was set at 9.8 fF, the capacitance of the capacitor C02 was set at 0.19 pF, and the inductance of the inductor L01 was set at 97.9 nH.

Figure 14A:
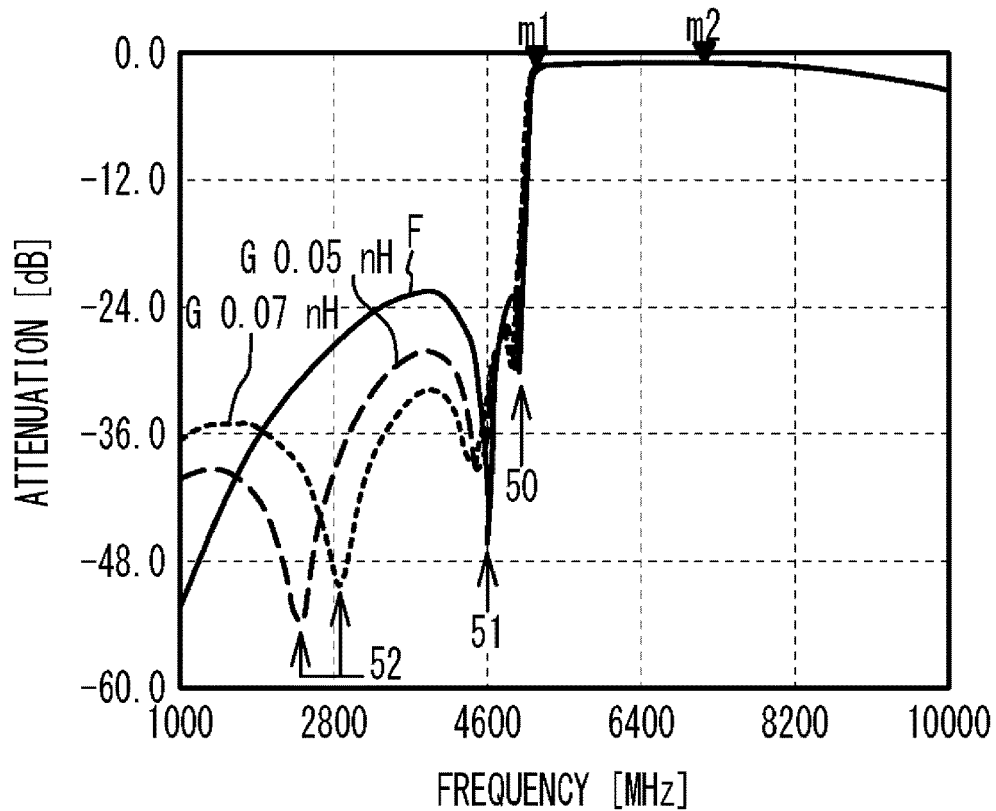
FIG. 14A and FIG. 14B illustrate transmission characteristics S21 of the filters F, G, and H in the simulation 2.
Figure 14B:
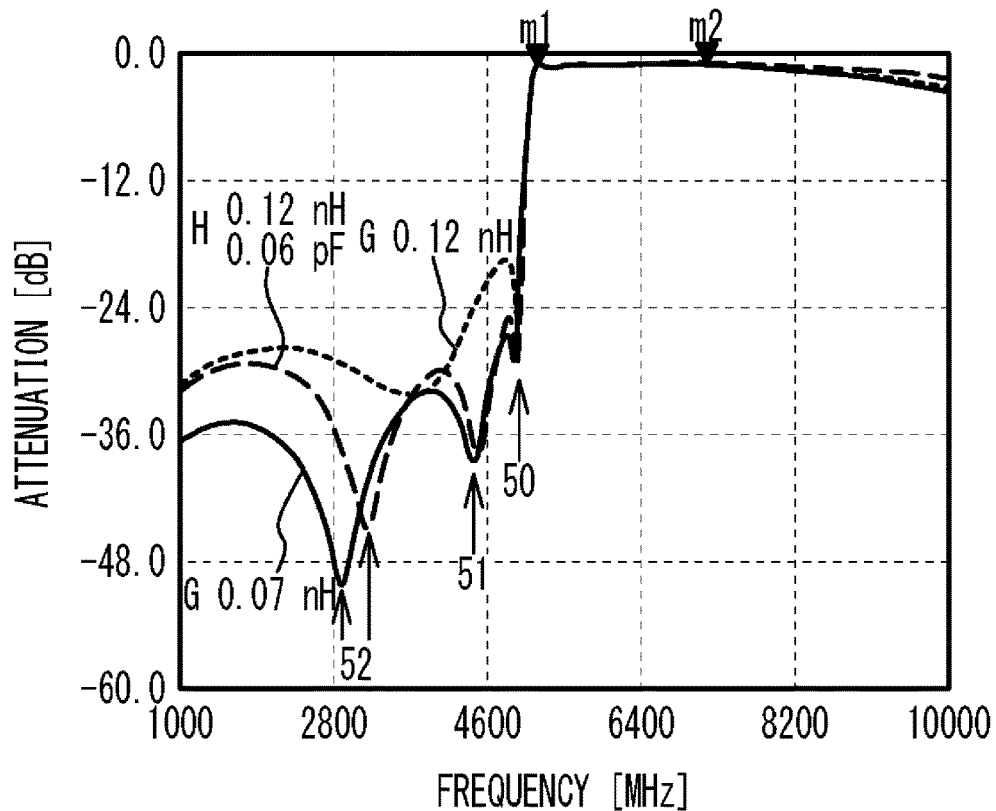

FIG. 14A and FIG. 14B illustrate the transmission characteristics S21 of the filters F, G, and H in the simulation 2. FIG. 14A illustrates the transmission characteristics of the filter F, the filter G of which the inductance of L7 is 0.05 nH, and the filter G of which the inductance of L7 is 0.07 nH. FIG. 14B illustrates the transmission characteristics of the filter G of which the inductance of L7 is 0.07 nH, the filter G of which the inductance of L7 is 0.12 nH, and the filter H.

As illustrated in FIG. 14A, in the filter F, the attenuation pole 52 is formed at 1000 MHz or less, and the attenuation at around 4000 MHz is small. In the filter G, as the inductance of the inductor L7 is increased, the frequency at which the attenuation pole 52 has a relative minimum becomes higher. Thus, the attenuation pole at around 4000 MHz becomes high. As described above, the provision of the inductor L7 increases the attenuation in the attenuation band.

As illustrated in FIG. 14B, in the filter G, when the inductance of the inductor L7 is 0.12 nH, the attenuation poles 51 and 52 become unified, and the attenuation becomes small. As in the filter H, the provision of the capacitor C7 separates the attenuation poles 51 and 52, and therefore the attenuation at around 4000 MHz becomes large. As seen above, even when it is impossible to reduce the inductance of the inductor L7, the provision of the capacitor C7 increases the attenuation in the attenuation band.

Other Circuit Configurations

Figure 15A:
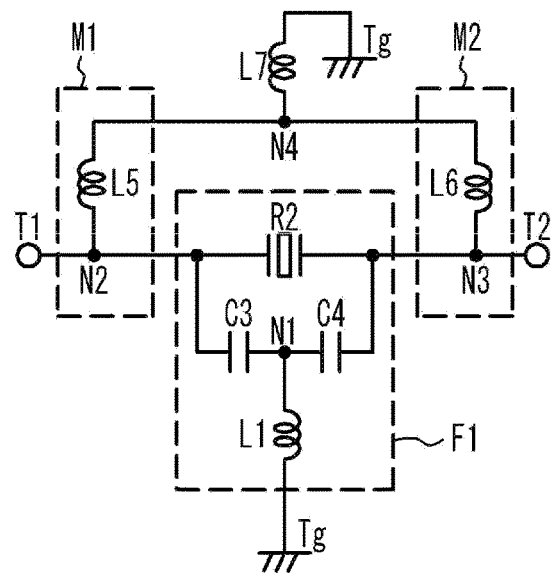
FIG. 15A to FIG. 15D are circuit diagrams illustrating other circuit configurations of a second embodiment.

FIG. 15A to FIG. 15D are circuit diagrams illustrating other circuit configurations of the second embodiment. As illustrated in FIG. 15A, the inductors L8 and L9 and the capacitors C5, C6, and C9 may be omitted. When an element having a first end connected to a ground and a second end connected to the node N1 is defined as a first element, an element connected between the signal terminal T1 and the signal terminal T2 is defined as a second element, an element connected in parallel to the second element between the signal terminals T1 and T2 is defined as a third element, and an element connected in series with the third element and connected in parallel to the second element between the signal terminals T1 and T2 is defined as a fourth element, the first element is the inductor L1, the second element is the acoustic wave resonator R2, the third element is the capacitor C3, and the fourth element is the capacitor C4. Other circuit configurations are the same as those of FIG. 13B, and the description thereof is thus omitted.

Figure 15B:
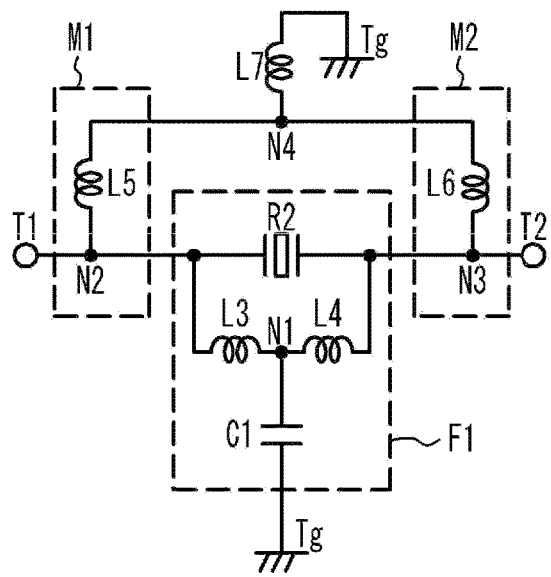
Figure 15C:
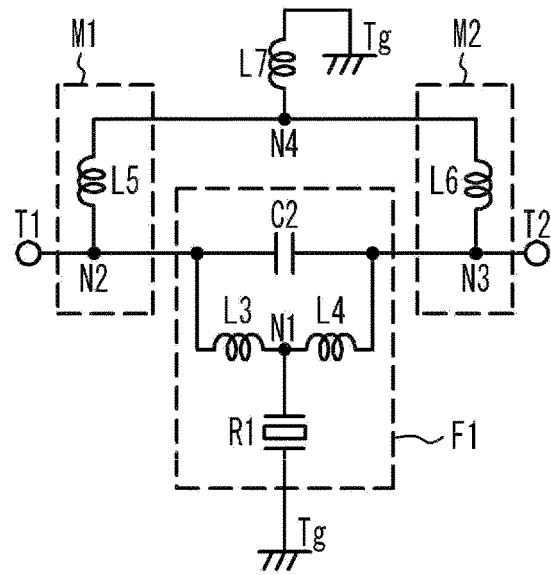
Figure 15D:
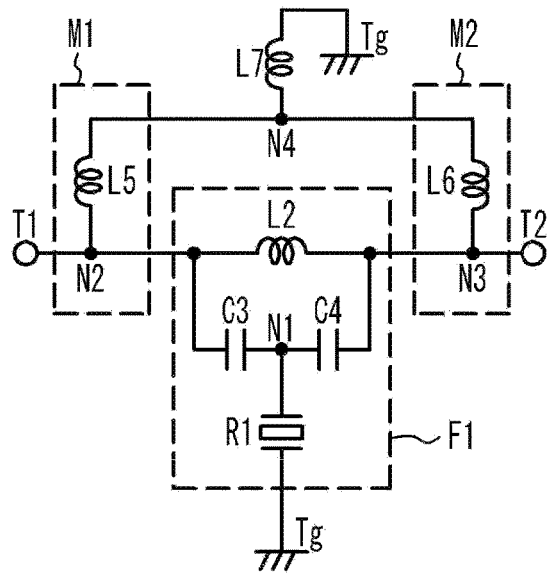

As illustrated in FIG. 15B, the first element may be the capacitor C1, the second element may be the acoustic wave resonator R2, the third element may be the inductor L3, and the fourth element may be the inductor L4. As illustrated in FIG. 15C, the first element may be the acoustic wave resonator R1, the second element may be the capacitor C2, the third element may be the inductor L3, and the fourth element may be the inductor L4. As illustrated in FIG. 15D, the first element may be the acoustic wave resonator R1, the second element may be the inductor L2, the third element may be the capacitor C3, and the fourth element may be the capacitor C4.

As described above, the first element is selected from a group consisting of the acoustic wave resonator R1, the inductor L1, and the capacitor C1. The second element is selected from the inductor L2 and the capacitor C2 when the first element is the acoustic wave resonator R1, and is the acoustic wave resonator R2 when the first element is the inductor L1 or the capacitor C1. The third element is selected from the inductor L3 and the capacitor C3, and the type of the third element differs from the type of the first element when the inductor or the capacitor is selected as the first element and differs from the type of the second element when the inductor or the capacitor is selected as the second element. The fourth element is selected from the inductor L4 and the capacitor C4, and the type of the fourth element is identical to the type of the third element.

The inductor L5 (a first inductor) has a first end connected to the node N2, which is located between the signal terminal T1 and the second element and between the signal terminal T1 and the third element. The inductor L6 (a second inductor) has a first end connected to the node N3, which is located between the signal terminal T2 and the second element and between the signal terminal T2 and the fourth element. The inductor L7 (a third inductor) has a first end connected to both the second end of the inductor L5 and the second end of the inductor L6, and has a second end connected to a ground. This structure improves the attenuation characteristic in the attenuation band without increasing the number of filters as in the filter G. The inductor L7 may be formed in the multilayered substrate 10 of the first embodiment, but the inductor L7 may be an inductor formed by the solder 34 between the ground terminal Tg of the multilayered substrate 10 and the terminal 32 of the mounting board 30.

As illustrated in FIG. 7B and FIG. 7C, the transmission characteristic of the filter has the attenuation pole 50 (a first attenuation pole) formed by one or more acoustic wave resonators R1 or R2, the attenuation pole 51 (a second attenuation pole) formed by the filter circuit F1, and the attenuation pole 52 (a third attenuation pole) formed by the filter circuit F1 and the inductors L5 to L7. The attenuation poles 50 to 52 are formed at frequencies lower than the passband. The attenuation pole 51 is formed between the attenuation pole 52 and the passband, and the attenuation pole 50 is formed between the attenuation pole 51 and the passband. As seen above, the acoustic wave resonator R1 or R2 increases the steepness of the attenuation between the passband and the attenuation band. In addition, provision of the inductor L7 shifts the attenuation pole 52 to a higher frequency. This improves the attenuation characteristic in the attenuation band.

As illustrated in FIG. 14B, when the inductance of the inductor L7 is excessively large, the attenuation in the attenuation band decreases. Therefore, the inductance of the inductor L7 is preferably less than the inductance of the inductor L5 and the inductance of the inductor L6. The inductance of the inductor L7 is more preferably equal to or less than $\frac{1}{5}$ of the inductance of the inductor L3 and $\frac{1}{5}$ of the inductance of the inductor L6, further preferably equal to or less than $\frac{1}{15}$ of the inductance of the inductor L3 and $\frac{1}{15}$ of the inductance of the inductor L6. When the inductance of the inductor L7 is excessively small, the effect of improving the attenuation characteristic is reduced. Thus, the inductance of the inductor L7 is more preferably equal to or greater than $\frac{1}{100}$ of the inductance of the inductor L3 and $\frac{1}{100}$ of the inductance of the inductor L6, further preferably equal to or greater than $\frac{1}{50}$ of the inductance of the inductor L3 and $\frac{1}{50}$ of the inductance of the inductor L6.

As in the filter G, the capacitor C5 (a first capacitor) connecting the first end of the inductor L5 to the second element and the third element and the capacitor C6 (a second capacitor) connecting the first end of the inductor L6 to the third element and the fourth element may be provided. This structure allows the matching circuit M1 to be formed of the inductor L5 and the capacitor C5, and the matching circuit M2 to be formed of the inductor L6 and the capacitor C6.

There may be a case where the inductance of the inductor L7 is not reduced. For example, when the inductor L7 is an inductor formed by the solder 34 between the ground terminal Tg of the multilayered substrate 10 and the terminal 32 of the mounting board 30, it may be impossible to reduce the inductance of the inductor L7. Thus, as in the filter H illustrated in FIG. 13C, the capacitor C7 (a third capacitor) connecting the first end of the inductor L5 to the first end of the inductor L6 is provided. This improves the attenuation characteristic in the attenuation band as in the filter H illustrated in FIG. 14B.

The capacitance of the capacitor C7 is preferably less than the capacitance of the capacitor C5 and the capacitance of the capacitor C6, more preferably equal to or less than $\frac{1}{10}$ of the capacitance of the capacitor C5 and $\frac{1}{10}$ of the capacitance of the capacitor C6.

The acoustic wave resonator R1 or R2 may be one acoustic wave resonator, or may be provided in plural.

Third Embodiment

Figure 16:
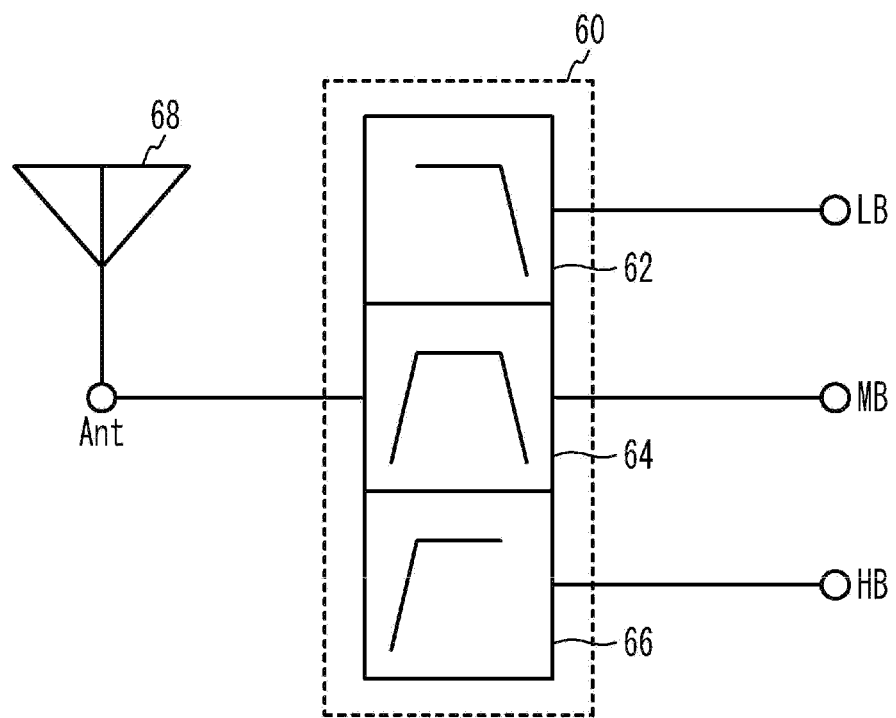
FIG. 16 is a circuit diagram of a diplexer in accordance with a third embodiment.

A third embodiment is an exemplary multiplexer to which the first and second embodiments and the variations thereof are applied. FIG. 16 is a circuit diagram of a triplexer in accordance with the third embodiment. As illustrated in FIG. 16, a triplexer 60 includes filters 62, 64, and 66. The filter 62 is connected between a common terminal Ant and a terminal LB, the filter 64 is connected between the common terminal Ant and a terminal MB, and the filter 66 is connected between the common terminal Ant and a terminal HB. An antenna 68 is connected to the common terminal Ant. The filter 62 is, for example, a low-pass filter, allows high-frequency signals in a low band to pass therethrough, and suppresses signals with other frequencies. The filter 64 is, for example, a bandpass filter, allows high-frequency signals in the middle band higher in frequency than the low band to pass therethrough, and suppresses signals with other frequencies. The filter 66 is, for example, a high-pass filter, allows high-frequency signal in the high band higher in frequency than the middle band to pass therethrough, and suppresses signals with other frequencies.

At least one of the filters 62, 64, 66 may be the filter according to any one of the first and second embodiments. A triplexer is described as an example of the multiplexer, but the multiplexer may be a diplexer, a duplexer, or a quadplexer.

Although the embodiments of the present invention have been described in detail, the present invention is not limited to such a specific embodiment, and it is to be understood that the various change, substitutions, and alterations could be made hereto without departing from the spirit and scope of the invention.

What is claimed is:

1. A filter comprising:
   a first signal terminal;
   a second signal terminal;
   a filter circuit connected between the first signal terminal and the second signal terminal;
   a multilayered substrate having a first surface and a second surface opposite from the first surface, the first signal terminal and the second signal terminal being located on the first surface and being in contact with the first surface, at least a part of the filter circuit being located at a side of the second surface;
   a line located between the first surface and the second surface in the multilayered substrate, the line being located closer to the first surface than the filter circuit, a first end of the line being connected to one of the first signal terminal and the second signal terminal; and
   a ground terminal that is located on the first surface and is in contact with the first surface and to which a second end of the line is connected, an area of a region where the line overlaps with the ground terminal being greater than an area of a region where the line overlaps with the one of the first signal terminal and the second signal terminal when the substrate is viewed in a plan view,
   wherein the area of the region where the line overlaps with the ground terminal in the plan view is equal to or greater than ½ of an area of the line in the plan view.

2. A multiplexer comprising:
   the filter according to claim 1.

3. The filter according to claim 1, wherein the filter circuit includes:
   a first element having a first end connected to a ground, the first element being selected from a group consisting of an acoustic wave resonator, an inductor, and a capacitor,
   a second element connected between the first signal terminal and the second signal terminal, the second element being selected from an inductor and a capacitor when the first element is an acoustic wave resonator, the second element being an acoustic wave resonator when the first element is an inductor or a capacitor,
   a third element that is connected in parallel to the second element between the first signal terminal and the second signal terminal and is selected from an inductor and a capacitor, a type of the third element being different from a type of the first element when an inductor or a capacitor is selected as the first element, the type of the third element being different from a type of the second element when an inductor or a capacitor is selected as the second element, and
   a fourth element that is connected in series with the third element and is connected in parallel to the second element between the first signal terminal and the second signal terminal, a second end of the first element being connected between the fourth element and the third element, a type of the fourth element being identical to the type of the third element.

4. The filter according to claim 1, wherein:
   the line is provided in plural,
   one of the lines connects the first signal terminal to the ground terminal, and an area of a region where the one of the lines overlaps with the ground terminal is greater than an area of a region where the one of the lines overlaps with the first signal terminal when the substrate is viewed in the plan view, and
   another one of the lines connects the second signal terminal to the ground terminal, and an area of a region where the another one of the lines overlaps with the ground terminal is greater than an area of a region where the another one of the lines overlaps with the second signal terminal when the substrate is viewed in the plan view.

5. The filter according to claim 1, wherein the filter circuit includes an acoustic wave resonator, an inductor, and a capacitor.

6. The filter according to claim 5, wherein:
   a transmission characteristic of the filter has a first attenuation pole formed by the acoustic wave resonator, a second attenuation pole formed by the filter circuit, and a third attenuation pole formed by the filter circuit and the line,
   the first attenuation pole, the second attenuation pole, and the third attenuation pole are formed at frequencies lower than a passband of the filter, and
   the second attenuation pole is formed between the third attenuation pole and the passband, and the first attenuation pole is formed between the second attenuation pole and the passband.

7. A filter comprising:
   a first signal terminal;
   a second signal terminal;
   a filter circuit connected between the first signal terminal and the second signal terminal;
   a substrate having a first surface and a second surface opposite from the first surface, the first signal terminal and the second signal terminal being located on the first surface, at least a part of the filter circuit being located at a side of the second surface;
   a line located closer to the first surface than the filter circuit in the substrate, a first end of the line being connected to one of the first signal terminal and the second signal terminal; and
   a ground terminal that is located on the first surface and to which a second end of the line is connected, an area of a region where the line overlaps with the ground terminal being greater than an area of a region where the line overlaps with the one of the first signal terminal and the second signal terminal when the substrate is viewed in a plan view,
   wherein:
   the line is provided in plural,
   the ground terminal is provided in plural so as to correspond to the lines, each of the ground terminals being connected to corresponding one of the lines, one of the lines is connected to the first signal terminal, and an area of a region where the one of the lines overlaps with the corresponding ground terminal is greater than an area of a region where the one of the lines overlaps with the first signal terminal when the substrate is viewed in the plan view, and another one of the lines is connected to the second signal terminal, and an area of a region where the another one of the lines overlaps with the corresponding ground terminal is greater than an area of a region where the another one of the lines overlaps with the second signal terminal when the substrate is viewed in the plan view.

\* \* \* \* \*